(12) United States Patent
Woo

(10) Patent No.: US 12,284,923 B2
(45) Date of Patent: Apr. 22, 2025

(54) THREE TERMINAL NEUROMORPHIC SYNAPTIC DEVICE AND METHOD FOR MANUFACTURING THE SAME

(71) Applicant: Kyungpook National University Industry-Academic Cooperation Foundation, Daegu (KR)

(72) Inventor: Jiyong Woo, Daegu (KR)

(73) Assignee: Kyungpook National University Industry-Academic Cooperation Foundation, Daegu (KR)

( * ) Notice: Subject to any disclaimer, the term of this patent is extended or adjusted under 35 U.S.C. 154(b) by 723 days.

(21) Appl. No.: 17/580,640

(22) Filed: Jan. 21, 2022

(65) Prior Publication Data

US 2022/0285615 A1    Sep. 8, 2022

(30) Foreign Application Priority Data

Mar. 5, 2021  (KR) ........................ 10-2021-0029314
Sep. 2, 2021  (KR) ........................ 10-2021-0117132

(51) Int. Cl.
  *H10N 70/20*   (2023.01)
  *G06N 3/065*   (2023.01)
  *H10N 70/00*   (2023.01)

(52) U.S. Cl.
  CPC .......... *H10N 70/253* (2023.02); *G06N 3/065* (2023.01); *H10N 70/011* (2023.02); *H10N 70/245* (2023.02); *H10N 70/8416* (2023.02); *H10N 70/8616* (2023.02); *H10N 70/8833* (2023.02)

(58) Field of Classification Search
  CPC .................................................. H10N 70/861
  See application file for complete search history.

(56) References Cited

U.S. PATENT DOCUMENTS

| 10,957,937 B2 | 3/2021 | Todorov et al. |
| 2020/0279154 A1* | 9/2020 | Todorov ............... H10N 70/841 |
| 2021/0125043 A1* | 4/2021 | Bragaglia .............. H01G 11/46 |

(Continued)

FOREIGN PATENT DOCUMENTS

| JP | 2003-131588 A | 5/2003 |
| JP | 2013-535805 A | 9/2013 |

(Continued)

*Primary Examiner* — Moazzam Hossain
*Assistant Examiner* — Hajar Kolahdouzan
(74) *Attorney, Agent, or Firm* — Park, Kim & Suh, LLC

(57) ABSTRACT

A three terminal neuromorphic synaptic device and a method for manufacturing the same are provided. The three terminal neuromorphic synaptic device includes a substrate, source/drain electrodes provided on the substrate, a channel region electrically connected between the source electrode and the drain electrode, an ion transfer layer provided on the channel region, a gate electrode provided on the ion transfer layer, and a voltage application unit to apply a gate voltage to the gate electrode. The ion transfer layer includes an electrolyte material to transfer an active ion of the gate electrode between the gate electrode and the channel region, in response to the gate voltage applied to the gate electrode. The voltage application unit adjusts a resistance and a conductance of the channel region by changing an amount of active ions accumulated in the channel region, depending on the number of times that the gate voltage is applied.

10 Claims, 18 Drawing Sheets

(56) References Cited

U.S. PATENT DOCUMENTS

2021/0265564 A1\* 8/2021 Ge .......................... G06N 3/063
2022/0271135 A1\* 8/2022 Mizushima ......... H01L 29/7883

FOREIGN PATENT DOCUMENTS

| JP | 2016-086167 A | 5/2016 |
| KR | 10-2007-0010805 A | 1/2007 |
| KR | 10-2015-0014577 A | 2/2015 |
| KR | 10-2018-0057384 A | 5/2018 |
| KR | 10-2002212 B1 | 7/2019 |
| KR | 10-2019-0124106 A | 11/2019 |
| KR | 10-2051041 B1 | 11/2019 |
| KR | 10-2020-0073027 A | 6/2020 |
| KR | 10-2020-0115722 A | 10/2020 |

\* cited by examiner

THREE TERMINAL NEUROMORPHIC SYNAPTIC DEVICE AND METHOD FOR MANUFACTURING THE SAME

STATEMENT REGARDING GOVERNMENT SPONSORED RESEARCH OR DEVELOPMENT

The present invention is derived from a research supported by the National Research Foundation (NRF) grant funded by the Korea government (MSIT) (NRF-2020M3F3A2A01081775). There is no property interest of the Korean government in any aspect of this invention.

CROSS-REFERENCE TO RELATED APPLICATIONS

A claim for priority under 35 U.S.C. § 119 is made to Korean Patent Applications No. 10-2021-0029314 filed on Mar. 5, 2021, and No. 10-2021-0117132 filed on Sep. 2, 2021, in the Korean Intellectual Property Office, the entire contents of which are hereby incorporated by reference.

BACKGROUND

Embodiments of the inventive concept described herein relate to a three terminal neuromorphic synaptic device.

A neuromorphic system may be implemented using a neuron principle. The neuromorphic system refers to a system that mimics the principle of processing data by a brain, as neurons constituting the brain are implemented using a plurality of devices. Accordingly, data may be processed and learned in a similar manner to that of the brain by using the neuromorphic system including neuron elements. In other words, one neuron element is connected to another neuron element through a synapse of the neuron element, and receives data from the another neuron element.

In this case, the neuron element stores and integrates the received data, and utters the received data at a threshold voltage or more. In other words, the neuron element stores and utters data. In addition, the neuromorphic synaptic device transmits input data to the neuron element by potentiating or depressing the input data. In other words, the neuromorphic synaptic device selectively outputs data based on an input voltage.

Meanwhile, to enhance the cognition accuracy of the neuromorphic synaptic system, a neuromorphic synaptic device to store analog information is needed rather than a digital memory to distinguish only between '1' and '0'. In particular, when the analog information is linearly increased in proportion to the number of times that a voltage is applied, the higher cognition accuracy similar to human cognition accuracy may be ensured. However, a conventional synaptic device based on a transistor has a limit in obtaining a linear change characteristic in a channel current in proportion to the number of times that the voltage is applied.

In addition, it is difficult for a conventional neuromorphic synaptic device to ensure more many multi-level states due to the limitation in changing a current. In other words, as the gate voltage is repeatedly applied, only five multi-level states from 'zero' to 'four' (0, 1, 2, 3, and 4) may be obtained, and there is a technical limitation in increasing the number of the multi-level states to five.

SUMMARY

Embodiments of the inventive concept provide a three terminal neuromorphic synaptic device capable of linearly adjusting a resistance and a conductance in a channel region by adjusting an active ion, such as a copper ion of a gate electrode, using a gate voltage.

Embodiments of the inventive concept provide a three terminal neuromorphic synaptic device and a method for manufacturing the same, capable of increasing a multi-level state.

The technical problems to be solved by the inventive concept are not limited to the aforementioned problems, and any other technical problems not mentioned herein will be clearly understood from the following description by those skilled in the art to which the inventive concept pertains.

According to an embodiment of the inventive concept, a three terminal neuromorphic synaptic device includes a substrate, a source electrode and a drain electrode provided on the substrate while being spaced apart from each other, a channel region provided to be electrically connected between the source electrode and the drain electrode, on the substrate, an ion transfer layer provided on the channel region, a gate electrode provided on the ion transfer layer, and a voltage application unit to apply a gate voltage to the gate electrode.

The ion transfer layer includes an electrolyte material to transfer the active ion of the gate electrode between the gate electrode and the channel region, in response to the gate voltage applied to the gate electrode. The voltage application unit adjusts a resistance and a conductance of the channel region by changing an amount of active ions accumulated in the channel region, depending on the number of times that the gate voltage is applied.

The channel region may include a tungsten trioxide ($WO_3$). The ion transfer layer may include a hafnium oxide ($HfO_2$). The gate electrode may include copper (Cu). The active ion may be a Cu ion. The ion transfer layer may be formed to have the thickness of 25 nm to 50 nm.

The ion transfer layer may include a first ion transfer layer and a second ion transfer layer. The gate electrode may include a first copper electrode, a second copper electrode, and a metal electrode. The ion transfer layer may include a copper metal material, for example, a material containing a copper metal, such as Cu, copper oxide ($CuO_2$), or Cu-doped HfOx. The metal electrode may include a metal material other than Cu. The ion transfer layer, the first copper electrode, and the second ion transfer layer, the second copper electrode, and the metal electrode may be sequentially stacked on the substrate. The first copper electrode and the second copper electrode may be formed with mutually different thickness.

According to an embodiment of the inventive concept, the three terminal neuromorphic synaptic device may further include a metal liner layer interposed between the ion transfer layer and the gate electrode to control the active ion. The metal liner layer may include at least one material of titanium nitride (TiN), titanium tungsten (TiW), or titanium (Ti).

According to an embodiment of the inventive concept, the three terminal neuromorphic synaptic device may further include a first heat blocking layer interposed between the substrate and the channel region. The first heat blocking layer includes a material having thermal conductivity lower than that of the channel region to increase the mobility of the active ion moving from the ion transfer layer to the channel region, and the current change between the source electrode and the drain electrode may be increased by the increased mobility of the active ion.

The first heat blocking layer may be provided by stacking a plurality of layers having the thermal conductivity equal to or less than the preset critical conductivity, and the plurality of layers may be provided by alternately stacking layers including materials having different thermal conductivity. The first heat blocking layer may include at least one material selected from a binary oxide, a ternary oxide, and a chalcogenide-based compound having preset critical thermal conductivity or less.

According to an embodiment of the inventive concept, the three terminal neuromorphic synaptic device may further include a second heat blocking layer provided while surrounding a side surface of the ion transfer layer. The second heat blocking layer may include a material having thermal conductivity and ion conductivity lower than thermal conductivity and ion conductivity of the ion transfer layer.

According to an embodiment of the inventive concept, a method for manufacturing a three terminal neuromorphic synaptic device includes forming a channel region, a source electrode, and a drain electrode on a substrate, forming an ion transfer layer on the channel region, forming a gate electrode for applying a gate voltage to the ion transfer layer, and forming a voltage application unit to apply a gate voltage to the gate electrode.

The ion transfer layer includes an electrolyte material to transfer the active ion of the gate electrode between the gate electrode and the channel region, in response to the gate voltage applied to the gate electrode. The voltage application unit is formed to change an amount of active ions accumulated in a region close to the channel region and a resistance of the channel region.

According to an embodiment of the inventive concept, the method for manufacturing a three terminal neuromorphic synaptic device may further include forming a heat blocking layer between the channel region and the ion transfer layer or on a side surface of the ion transfer layer.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
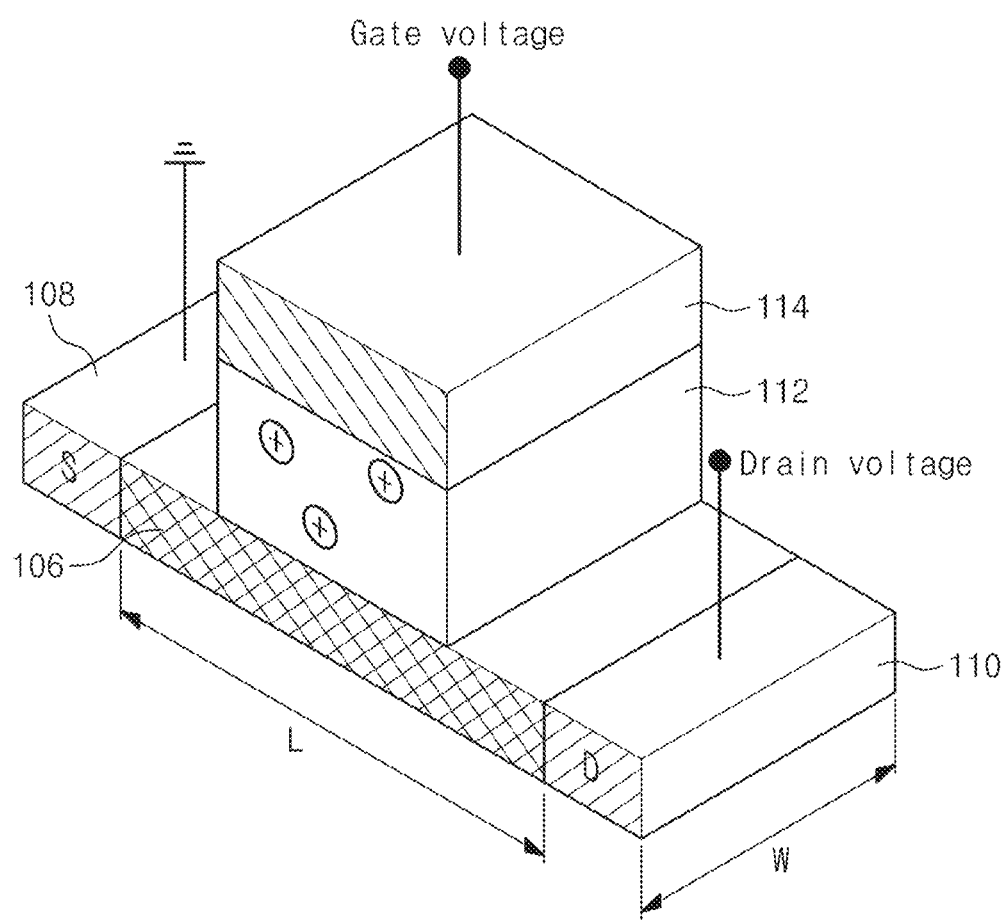
FIG. 1 is a conceptual view of a three terminal neuromorphic synaptic device, according to a first embodiment of the inventive concept.

Hereinafter, an embodiment of the inventive concept will be described in more detail with reference to the accompanying drawings. The embodiments of the inventive concept may be modified in various forms, and the scope of the inventive concept should not be construed to be limited by the embodiments of the inventive concept described in the following. The present embodiments are provided to describe the inventive concept for those skilled in the art more completely. Accordingly, the shapes and the like of the components in the drawings are exaggerated to emphasize clearer descriptions.

Hereinafter, the feature of the inventive concept will be described in detail with reference to exemplary embodiments and accompanying drawings to clarify solutions of problems to be solved according to the inventive concept. In the following description, the same reference numerals will be assigned to the same components even though the components are illustrated in different drawings. In addition, when the description is made with reference to a present drawing, a component in another drawing may be cited if necessary. Meanwhile, the terms "up", "down", "one side", or "opposite side", which represents directionality, are used the orientations of accompanying drawings. According to an embodiment of the inventive concept, positions of components can be set in various orientations. Accordingly, the terms related to the directionality is provided for the convenience of example, but the inventive concept is not limited thereto.

In addition, although the terms first, second, etc. may be used herein to describe various components, these components should not be limited by these terms. The terms are only used to distinguish one component from another component. For example, without departing from the scope and spirit of the inventive concept, a first component may be referred to as a second component, and similarly, the second component may be referred to as the first component.

FIG. 1 is a conceptual view of a three terminal neuromorphic synaptic device, according to a first embodiment of the inventive concept. Referring to FIG. 1, the three terminal neuromorphic synaptic device 100 according to an embodiment of the inventive concept may include a channel region 106, a source electrode 108, a drain electrode 110, an ion transfer layer 112, a gate electrode 114, and a voltage application unit (not illustrated) formed on a substrate (not illustrated in FIG. 1).

The source electrode 108 and the drain electrode 110 may be spaced apart from each other on the substrate. The substrate may be a silicon substrate, a silicon-on-insulator (SOI) substrate, a germanium substrate, a germanium-on-insulator (GOI) substrate, a silicon-germanium substrate, a TiN substrate, and a tungsten substrate, but is not limited thereto. According to an embodiment, the substrate may include a p-type semiconductor substrate doped with p-type dopants or an n-type semiconductor substrate doped with n-type dopants.

According to an embodiment, the substrate and the source electrode 108 may be electrically connected to the ground. The channel region 106 may be provided to be electrically connected between the source electrode 108 and the drain electrode 110 on the substrate. According to an embodiment, the source electrode 108 and/or the drain electrode 110 may include at least one metal material selected from the group consisting of aluminum (Al), copper (Cu), nickel (Ni), iron (Fe), chromium (Cr), titanium (Ti), zinc (Zn), lead (Pb), gold (Au), and silver (Ag). The source electrode 108 and/or the drain electrode 110 may include a conductive polymer material or a doped polymer material.

The channel region 106 may serve to accumulate active ions moved from the ion transfer layer 112 to the channel region 106. The channel region 106 may be formed on the substrate through various deposition manners. According to an embodiment, the channel region 106 may include any one of a low molecular organic semiconductor, an organic semiconductor, a conductive polymer, an inorganic semiconductor, an oxide semiconductor, a two-dimensional semiconductor, and a material having quantum dots.

The channel region 106 may include at least one material selected from the group consisting of tungsten (W), cobalt (Co), molybdenum (Mo), titanium (Ti), and tantalum (Ta). The channel region 106 may be, for example, a metal-oxide based material, a chalcogenide based material, or a metal material, such as $WO_3$ and $TiO_2$, which is changed in valence, but is not limited thereto. For example, the channel region 106 may include various materials changed in conductance by active ions.

The ion transfer layer 112 may be provided on the channel region 106. The ion transfer layer 112 may transfer active ions of the gate electrode 114, between the gate electrode 114 and the channel region 106, depending on a gate voltage applied to the gate electrode 114. According to an embodiment, the ion transfer layer 112 may include an electrolyte material for moving active ions, which are formed in the ion transfer layer 112, to the channel region 106 or for transferring active ions moved to the channel region 106 again, depending on the gate voltage applied to the gate electrode 114.

As the ion transfer layer 112 includes an ionic material, the ion transfer layer 112 exhibits synaptic characteristics. In other words, a synaptic stimulation spike moves the active ions toward the channel region 106, which is formed under the ion transfer layer 112, to generate an Excitation Post-Synaptic Current (that is, a source-drain current). Then, the channel region 106 accumulates the active ions moved to the channel region 100. The active ions formed in the ion transfer layer 112 may include cations, such as Cu+, H+, Li+, Na+, Ag+, or anions such as O2-. The ion transfer layer 112 may include an electrolyte material for smoothly transferring $HfOx$, $SiO_2$, or $MoO_3$, especially, Cu ions.

The gate electrode 114 may be provided on the ion transfer layer 112. According to an embodiment, the gate electrode 114 may include a metal layer and/or a barrier metal layer. The metal layer may include at least one material selected from the group consisting of copper (Cu), tungsten (W), hafnium (Hf), zirconium (Zr), titanium (Ti), tantalum (Ta), aluminum (Al), ruthenium (Ru), palladium (Pd), platinum (Pt), cobalt (Co), nickel (Ni), and a conductive metal nitride, or the combination thereof. The barrier metal film may include, for example, a metal nitride film, such as titanium nitride, a tantalum nitride, a tungsten nitride, a hafnium nitride, or a zirconium nitride.

When a voltage is applied to the gate electrode 114, active ions move between the ion transfer layer 112 and the channel region 106 by the applied voltage, and an amount of active ions in the channel region 106 is changed due to the movement of the active ions, such that the conductivity of the channel region 106 is changed. Accordingly, a depression characteristic and a potentiation characteristic which are synaptic characteristics may be exhibited.

The voltage application unit may be configured to apply a drain voltage to the drain electrode 110 and apply a gate voltage to the gate electrode 114. The voltage application unit may adjust the resistance and conductance of the channel region 106 by changing the amount of active ions accumulated in the channel region 106 depending on the number of times that the gate voltage is applied.

Figure 2:
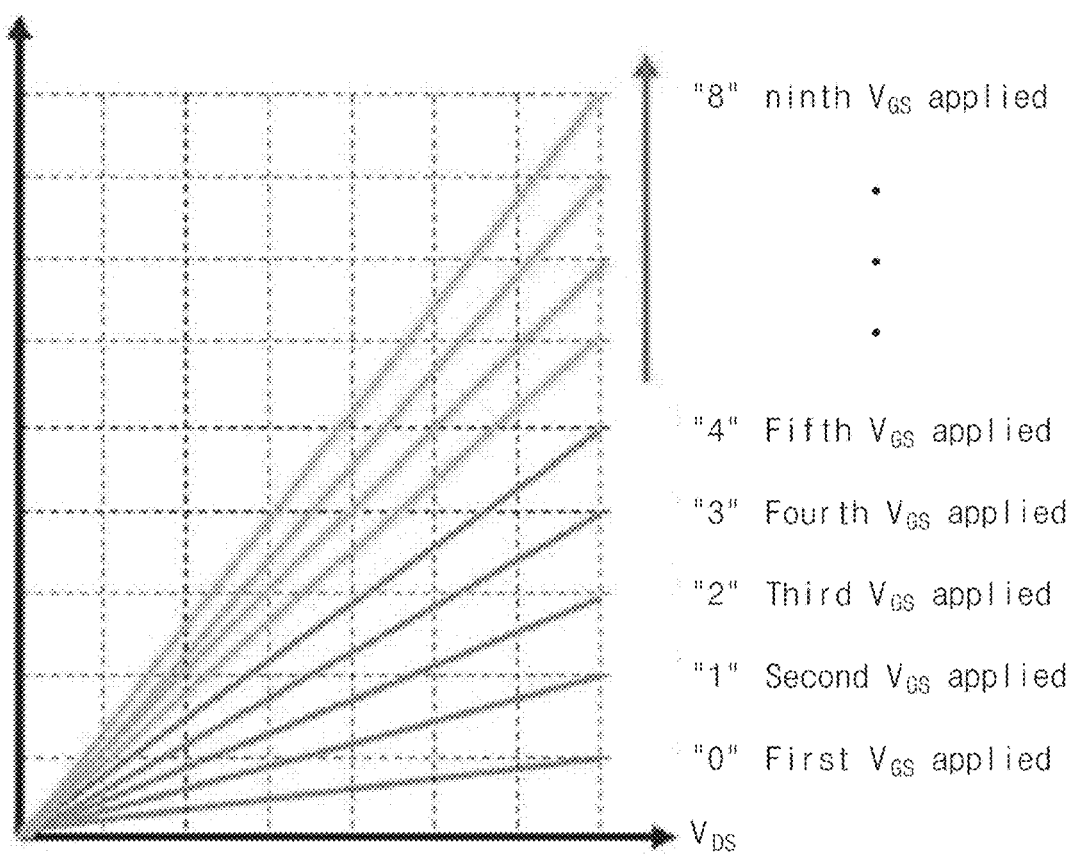
FIG. 2 is a graph illustrating a current characteristic (an excitatory post-synaptic current) of a three terminal neuromorphic synaptic device, according to an embodiment of the inventive concept.

FIG. 2 is a graph illustrating a current characteristic (an excitatory post-synaptic current) of a three terminal neuromorphic synaptic device, according to an embodiment of the inventive concept. Referring to FIGS. 1 and 2, it may be recognized that, whenever the voltage is applied to the gate electrode 114, as the active ions are accumulated in the channel region 106, the excitatory post-synaptic current is linearly increased. The change extent (change) in the excitatory post-synaptic current is increased by increasing the mobility of the active ions moving from the ion transfer layer 112 to the channel region 106, thereby increasing the number of times that the voltage is applied to the gate electrode 114 to nine. Accordingly, the three terminal neuromorphic synaptic device 100 shows nine multi-level states ranging from zero to eight.

An experiment was performed to verify the performance of the three terminal neuromorphic synaptic device 100 according to an embodiment of the inventive concept. The three terminal neuromorphic synaptic device 100 was manufactured by sequentially forming the channel region (channel layer) 106 including $WO_3$, the ion transfer layer 112 including HfOx, and the gate electrode 114 including Cu. The region of the gate overlapping the channel has the effective cell size. The channel layer of $WO_3$ was deposited on a $SiO_2$/Si substrate through reactive sputtering using a tungsten (W) metal target, argon (Ar), and oxygen ($O_2$) plasma. The gas flow rates of argon (Ar), and oxygen ($O_2$) were set to 12 sccm and 1 sccm, respectively. The source and drain electrodes were formed by depositing tungsten metal at opposite ends of the channel region 106. The ion transfer layer 112 was formed by depositing an HfOx electrolyte to a thickness of 35 nm. The gate electrode 114 including Cu was formed at an intermediate portion of the channel region 106.

Figure 3:
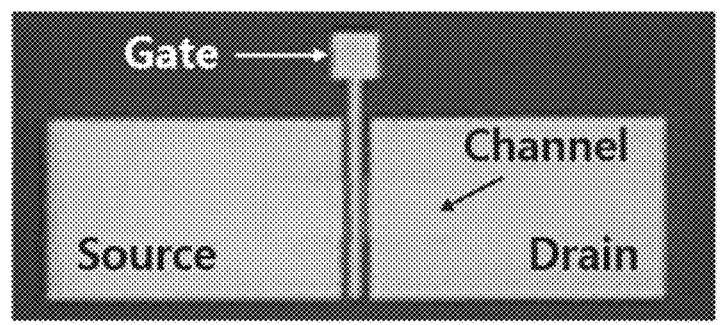
FIG. 3 is a microscopic image of a three terminal neuromorphic synaptic device manufactured according to an embodiment of the inventive concept.
Figure 4:
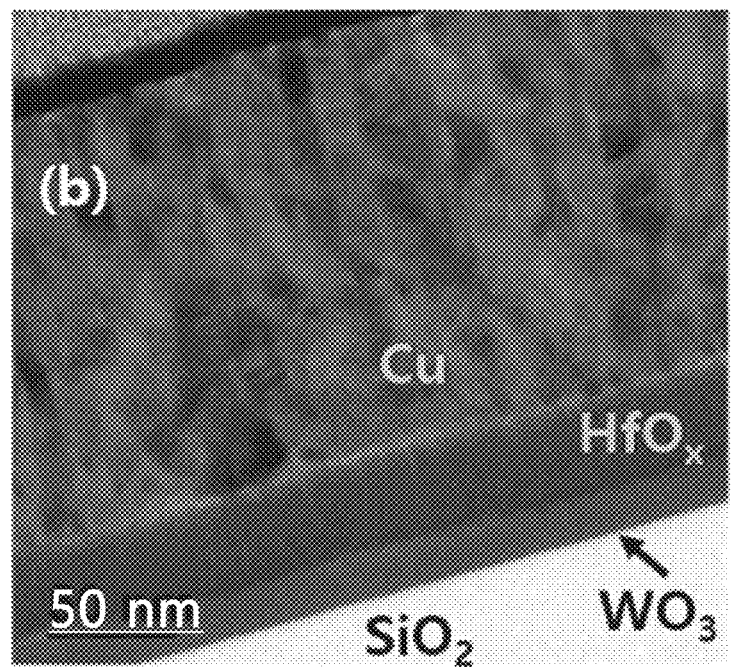
FIG. 4 is a transmission electron microscopy (TEM) image of a three terminal neuromorphic synaptic device manufactured according to an embodiment of the inventive concept.
Figure 5:
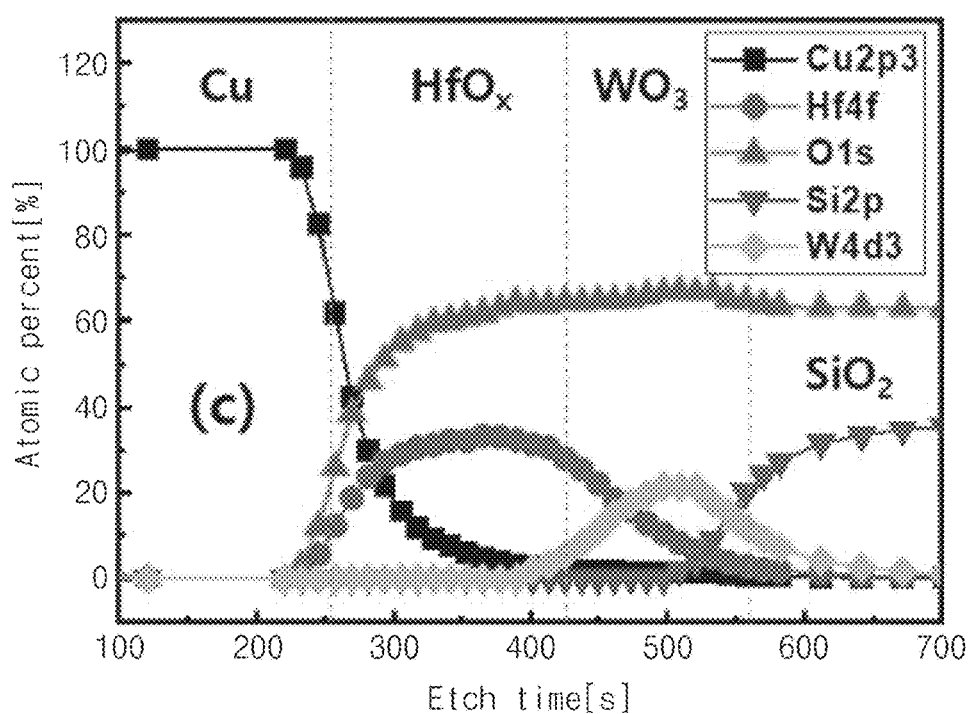
FIG. 5 illustrates a X-ray photoelectron spectroscopy (XPS) depth profiling result of a three terminal neuromorphic synaptic device manufactured according to an embodiment of the inventive concept.

FIG. 3 is a microscopic image of a three terminal neuromorphic synaptic device manufactured according to an embodiment of the inventive concept. FIG. 4 is a transmission electron microscopy (TEM) image of a three terminal neuromorphic synaptic device manufactured according to an embodiment of the inventive concept. FIG. 5 illustrates a X-ray photoelectron spectroscopy (XPS) depth profiling result of a three terminal neuromorphic synaptic device manufactured according to an embodiment of the inventive concept.

Figure 6:
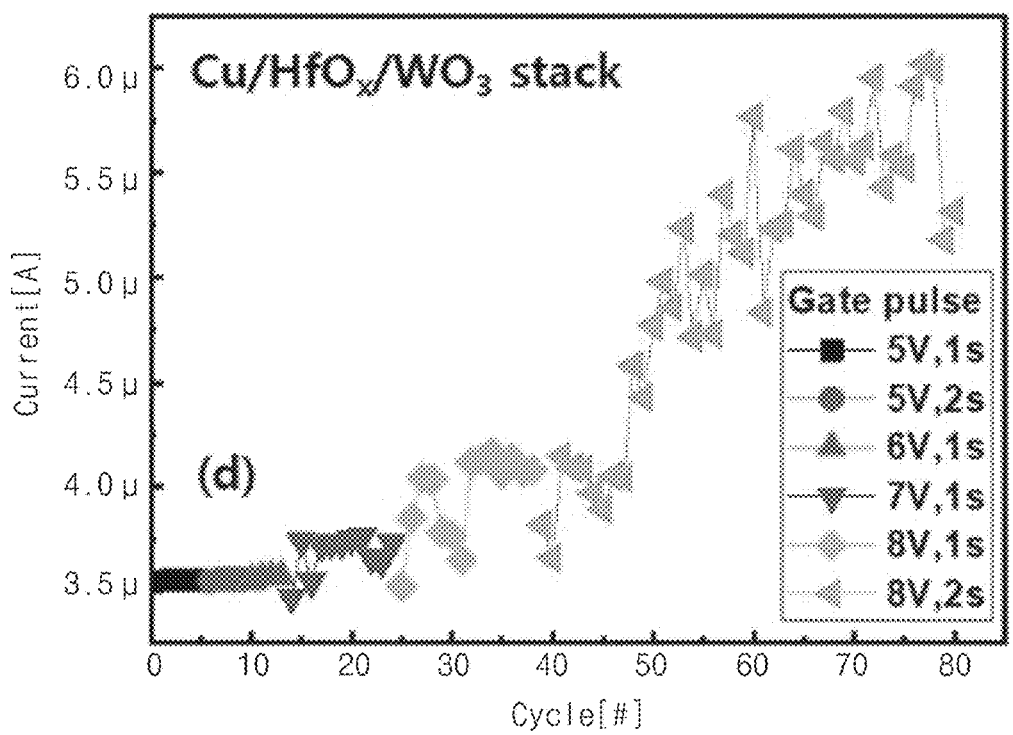
FIG. 6 is a result illustrating a change in current between a drain and a source, as a function of a gate voltage pulse of a three terminal neuromorphic synaptic device manufactured according to an embodiment of the inventive concept.
Figure 7:
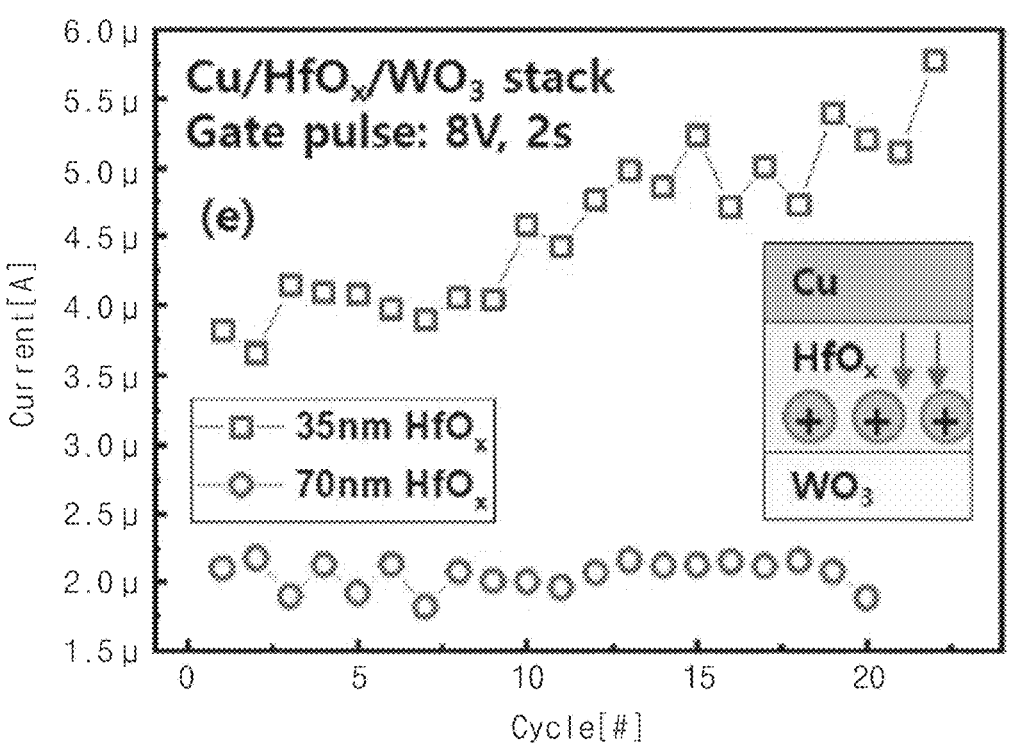
FIG. 7 is a result illustrating a change in current between a drain and a source, as a function of the thickness of an ion transfer layer constituting a three terminal neuromorphic synaptic device manufactured according to an embodiment of the inventive concept.

The voltage of 0.5 V was applied to the drain electrode 110 of the three terminal neuromorphic synaptic device 100 manufactured according to the embodiment of the inventive concept, and a channel current flowing between the drain electrode 110 and the source electrode 108 was measured in the state that the source electrode 108 was grounded. The channel distance L and the channel width W are designed to be 100 μm. The channel current represents a synaptic weight of the synaptic device. FIG. 6 is a result illustrating a change in current between a drain and a source, as a function of a gate voltage pulse of a three terminal neuromorphic synaptic device manufactured according to an embodiment of the inventive concept. FIG. 7 is a result illustrating a change in current between a drain and a source, as a function of the thickness of the ion transfer layer constituting the three terminal neuromorphic synaptic device 100 manufactured according to an embodiment of the inventive concept.

When the pulse size of the gate voltage is less than or equal to 7 V (1 second pulse width), no special change in channel current is observed. The channel current was significantly increased at a gate voltage pulse size of 8 V. This means that a gate voltage greater than or equal to a threshold voltage should be applied to the gate electrode to induce Cu ions to the channel region. When Cu ions reach the $WO_3$ channel region by the gate voltage pulse, the W valence is changed at the interface to reduce the resistance of the channel region and increase the conductance, thereby increasing the channel current. During potentiation, the channel current increased as the gate voltage pulse is applied.

Figure 8:
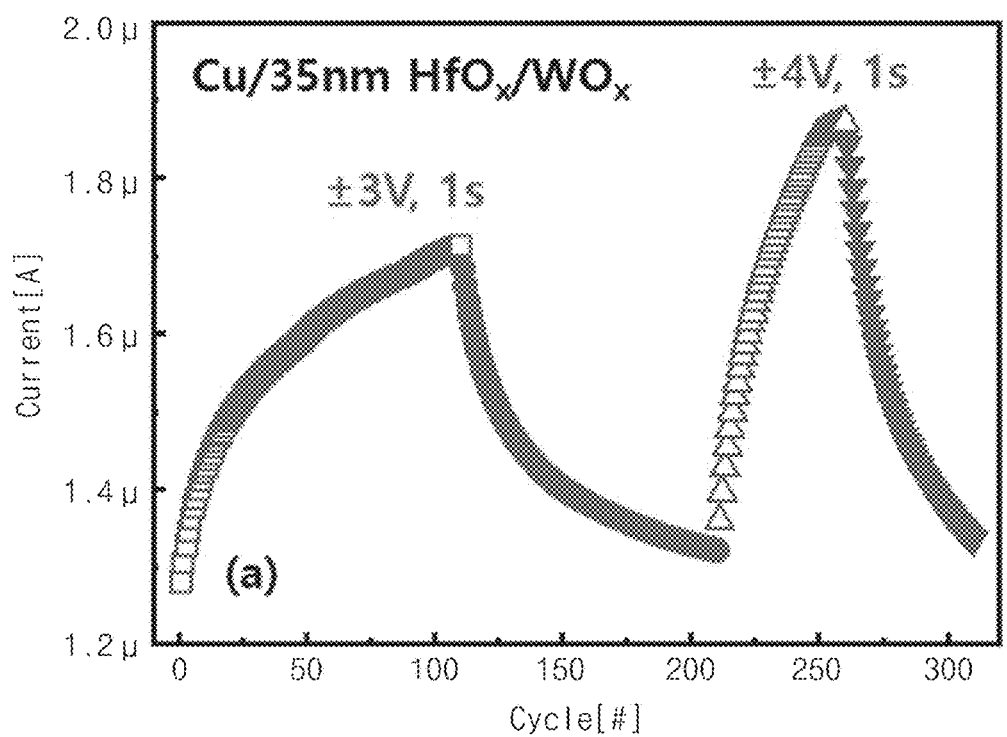
FIGS. 8 and 9 are views illustrating a change in current between a drain and a source as a function of a gate voltage pulse of a three terminal neuromorphic synaptic device manufactured according to an embodiment of the inventive concept.
Figure 9:
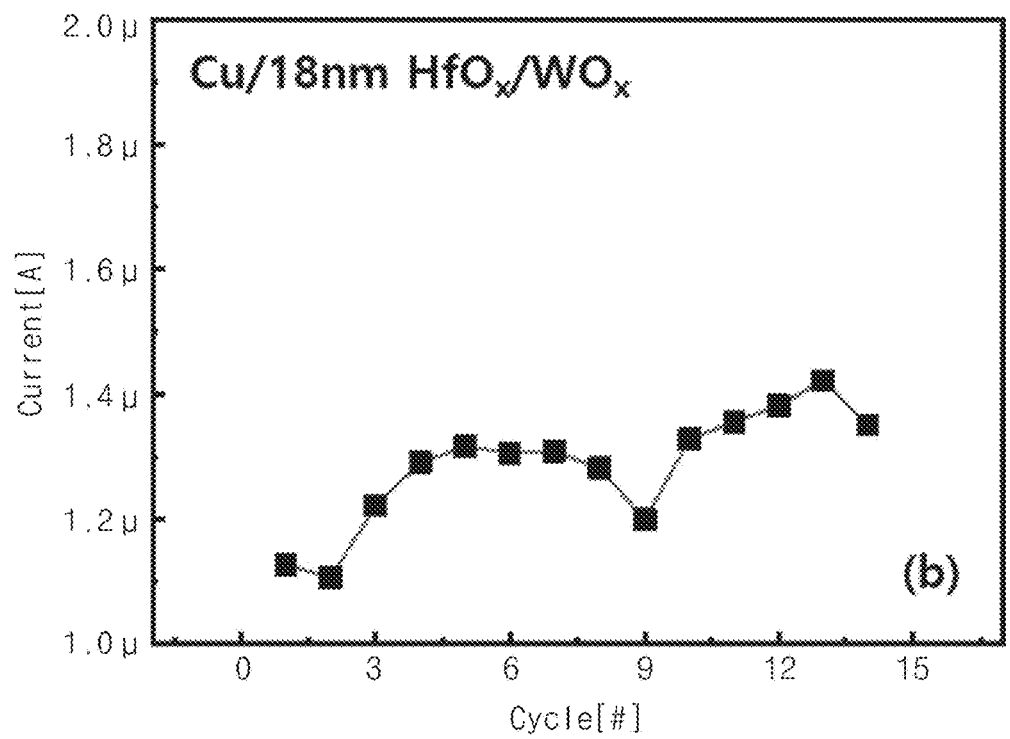
Figure 10:
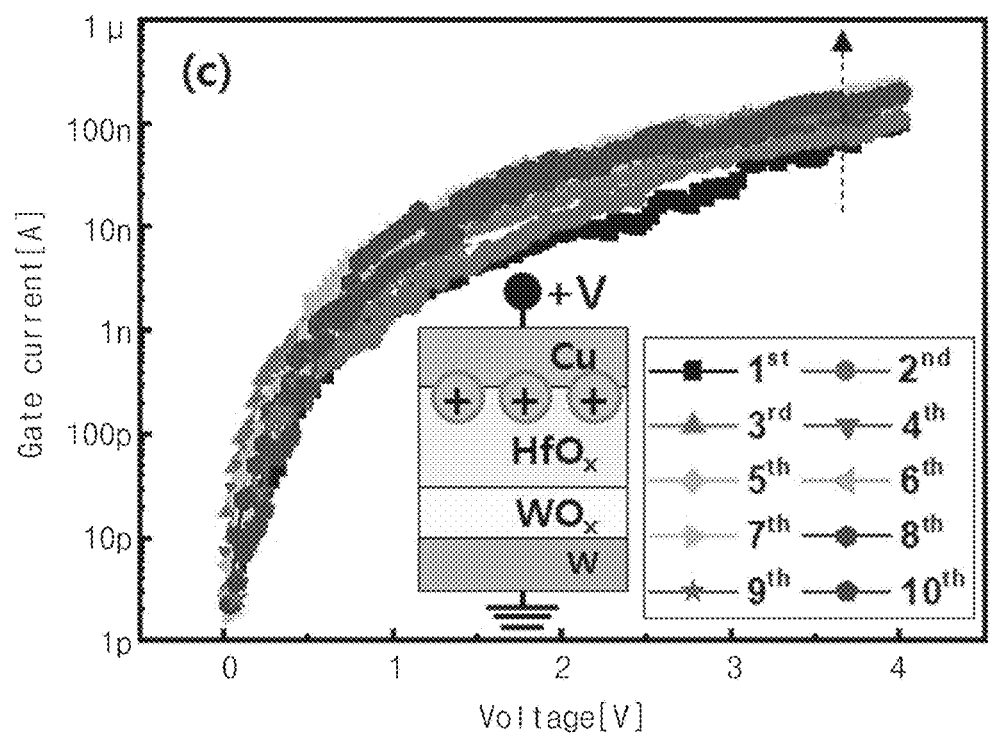
FIGS. 10 and 11 are views illustrating a change in a gate current, as a function of a gate voltage of a three terminal neuromorphic synaptic device manufactured according to an embodiment of the inventive concept.
Figure 11:
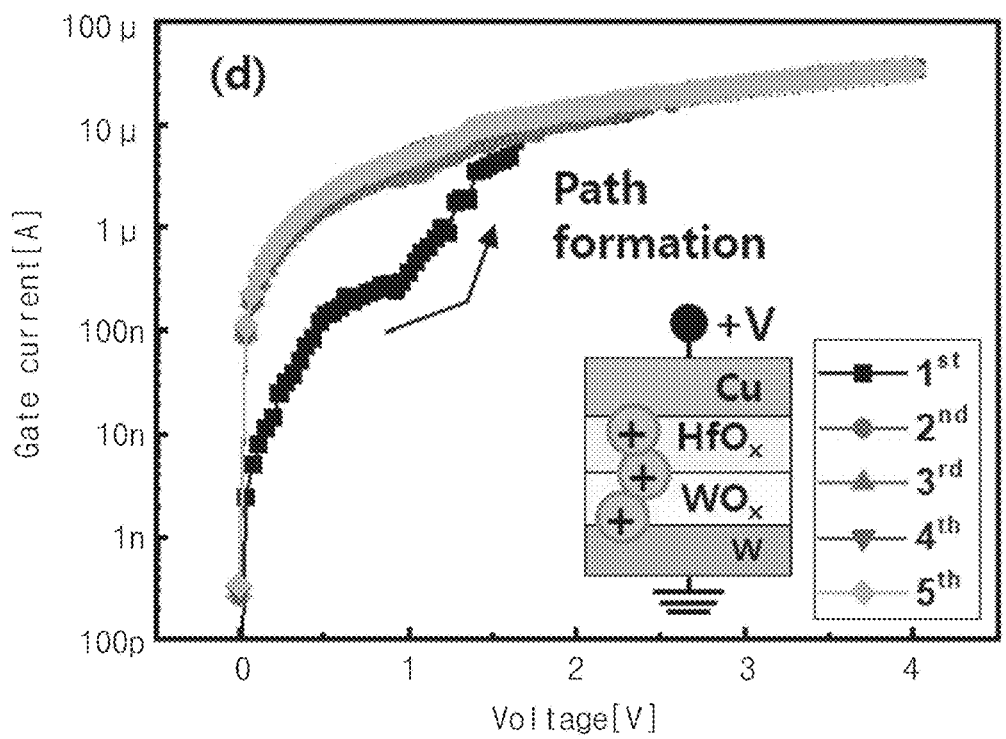

As illustrated in FIG. 7, it may be recognized that a W valence is reduced due to an electric field, which is reduced, when the HfOx electrolyte ion transfer layer 12 is formed to the thickness of 70 nm. Accordingly, it is preferred that the gate voltage is smoothly transferred to the HfOx electrolyte (the ion transfer layer) while the WOx channel layer having the lower resistance is formed, to accelerate the movement of Cu ions, According to the reactive sputtering manner, the resistance is changed sensitively to oxygen, so it is difficult to adjust the resistance. Accordingly, the WOx channel layer was formed with a resistance 10 times lower than that of $WO_3$ by sputtering a single WOx oxide FIGS. 8 and 9 are views illustrating a change in current between a drain and a source as a function of a gate voltage pulse of a three terminal neuromorphic synaptic device manufactured according to an embodiment of the inventive concept. FIGS. 10 and 11 are views illustrating a change in a gate current, as a function of a gate voltage of a three terminal neuromorphic synaptic device manufactured according to an embodiment of the inventive concept. The gate current was measured based on a current flowing from the Cu gate electrode to the W source electrode. FIGS. 8 and 10 illustrate the case that the thickness of the ion transfer layer is 35 nm, and FIGS. 9 and 11 illustrate the case that the thickness of the ion transfer layer is 18 nm. It may be recognized from FIGS. 8 and 9 that it is difficult to adjust the channel current by the gate voltage pulse, when the thickness of the HfOx electrolyte (the ion transfer layer) is excessively thin. Accordingly, it is preferred that the thickness of the ion transfer layer is designed to be in the range of about 25 nm to 50 nm.

In the three terminal neuromorphic synaptic device having the channel distance and the channel width 'W' of 100 μm and 5 μm, respectively, the analog synaptic characteristics were reversibly observed in two gate voltage polarities in even a low gate voltage magnitude of ±3 V. In addition, the channel current may be adjusted, as the gate voltage pulse is applied at the smaller number of frequencies, and the adjustment range of the channel current flowing between the drain and the source is increased, as the gate voltage is increased to ±4 V to evaluate the adjustment performance. Meanwhile, when the thickness of the HfOx electrolyte is reduced to about half of 18 nm, the gradual change in the channel current by the applied gate voltage pulse was not observed any more, and the channel current was randomly changed. To determine the cause of the above phenomenon, a gate current flowing from the copper (Cu) gate electrode to the tungsten (VV) source electrode was measured.

Referring to FIG. 10, for a device including an HfOx electrolyte having the thickness of 35 nm, a gate current of several hundred nA was sufficient to trigger a channel current, when a gate voltage of 4 V was applied. A gradually increasing gate current means that Cu ions continuously and smoothly moved across the entire portion of a HfOx layer. The gate current of less than 1 nA measured at the gate voltage of 0.5 V is much lower than the channel current in the level of μA.

However, for a device including the HfOx electrolyte having the thickness of 18 nm, a higher gate current is generated as illustrated in FIG. 11. Furthermore, during the first sweep operation, the gate current tends to suddenly increase at the gate voltage of about 1 V. This means that the higher gate current is induced, as Cu ions are locally collected to form a conductive path. When the gate voltage is 0.5 V, the gate current is in the level of μA which is close to the level of the channel current. Accordingly, the channel control by the gate voltage pulse is inefficient.

Figure 12:
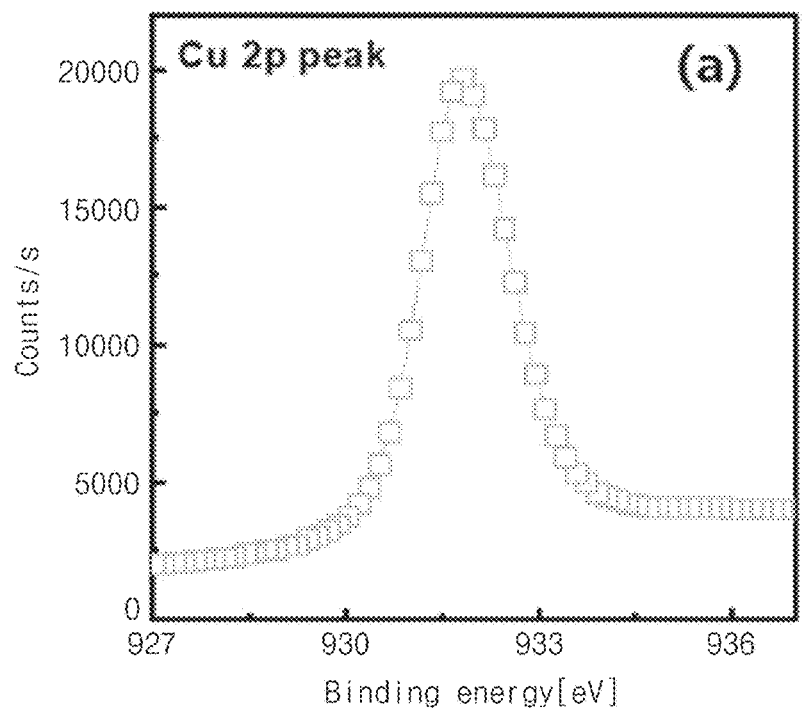
FIG. 12 illustrates the result of XPS analysis for Cu of a three terminal neuromorphic synaptic device manufactured according to an embodiment of the inventive concept.
Figure 13:
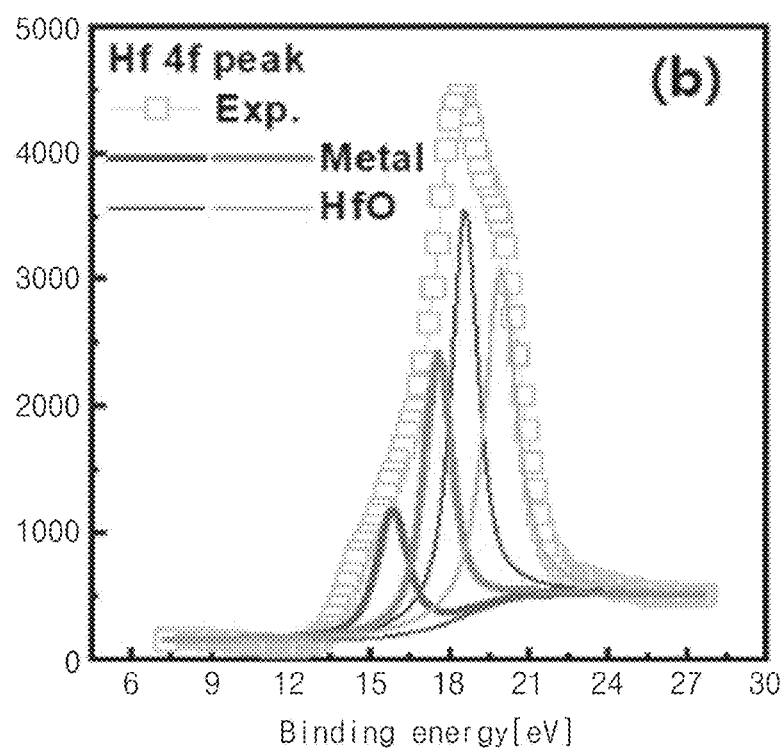
FIG. 13 illustrates XPS analysis for HfOx of a three terminal neuromorphic synaptic device manufactured according to an embodiment of the inventive concept.
Figure 14:
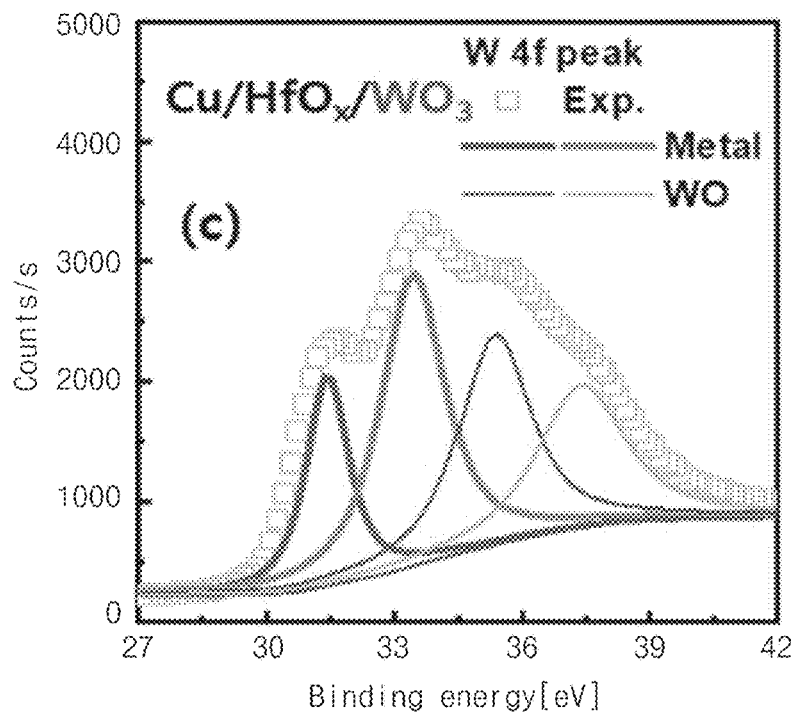
FIG. 14 illustrates XPS analysis for $WO_3$ of a three terminal neuromorphic synaptic device manufactured according to an embodiment of the inventive concept.
Figure 15:
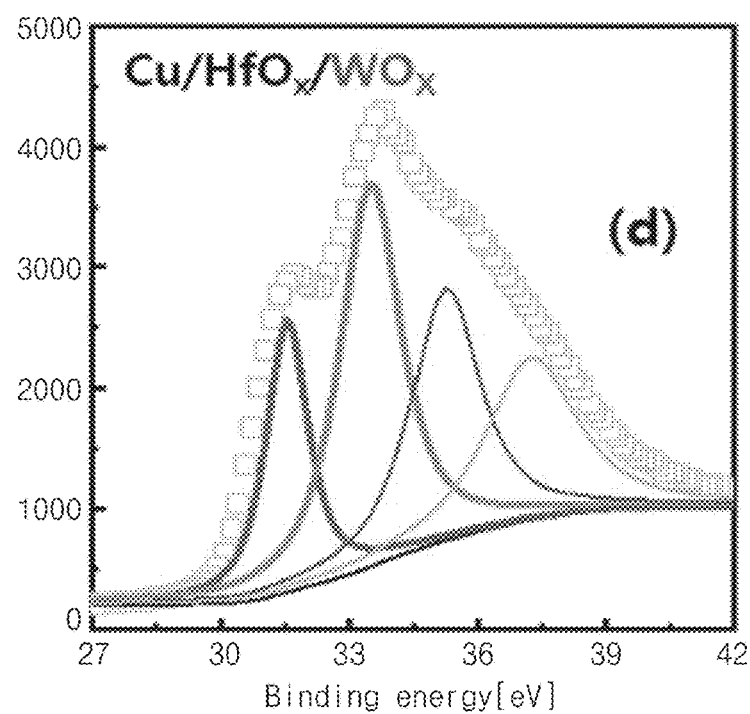
FIG. 15 illustrates an XPS analysis result for $WO_x$ of a three terminal neuromorphic synaptic device manufactured according to an embodiment of the inventive concept.
Figure 16:
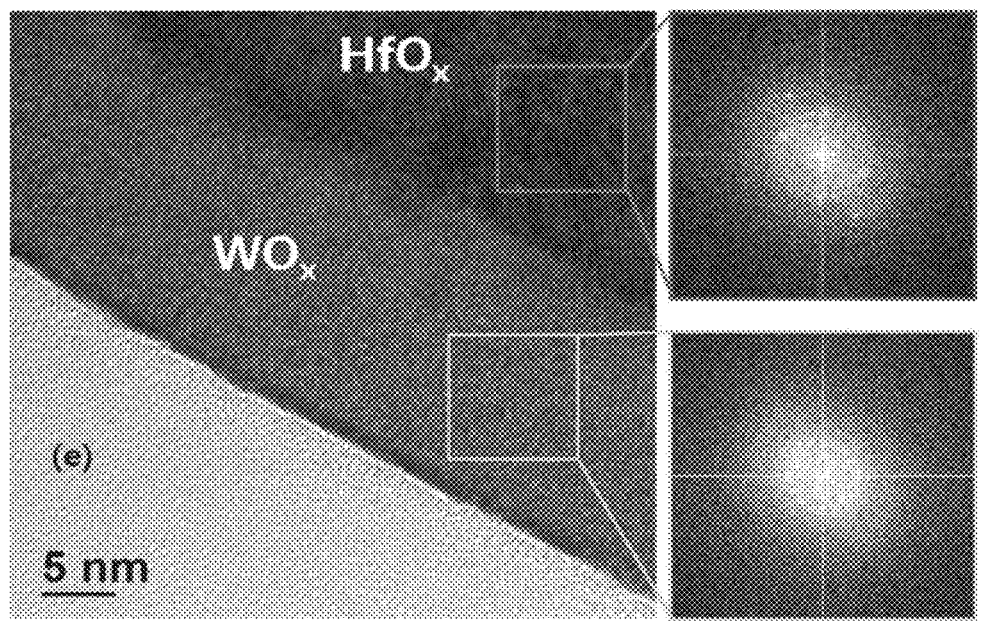
FIG. 16 illustrates a TEM image obtained through Fast Fourier Transform in a three terminal neuromorphic synaptic device manufactured according to an embodiment of the inventive concept.
Figure 17:
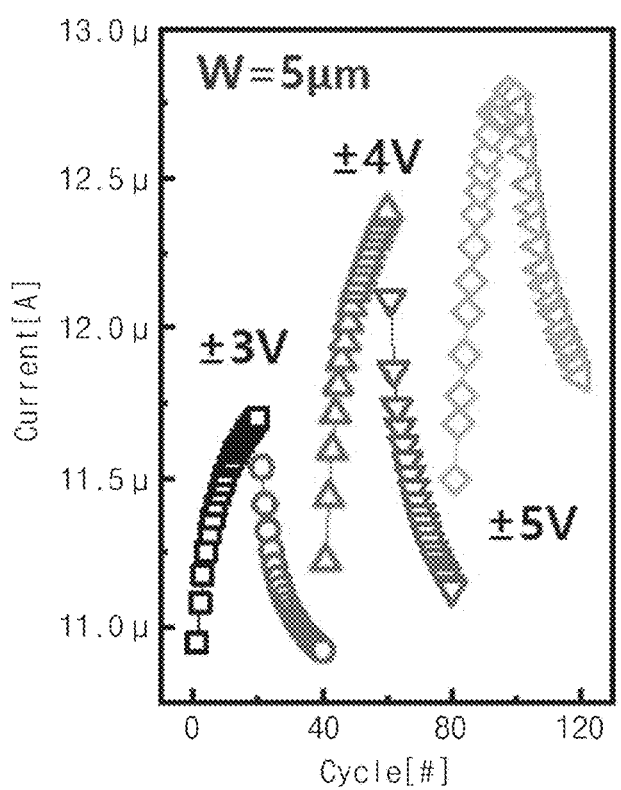
FIGS. 17 to 21 are views illustrating the change characteristic of a channel current as a function of a channel width (5 μm, 10 μm, 20 μm, 50 μm, or 100 μm) of a three terminal neuromorphic synaptic device manufactured according to an embodiment of the inventive concept.
Figure 18:
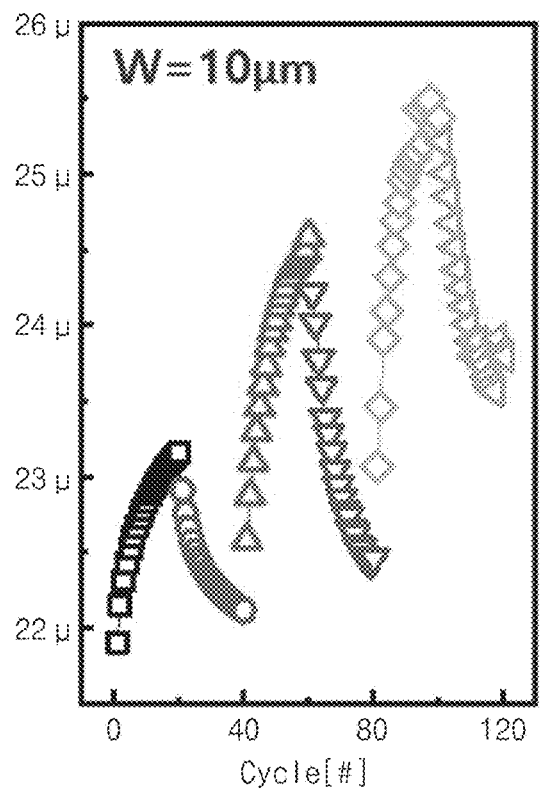
Figure 19:
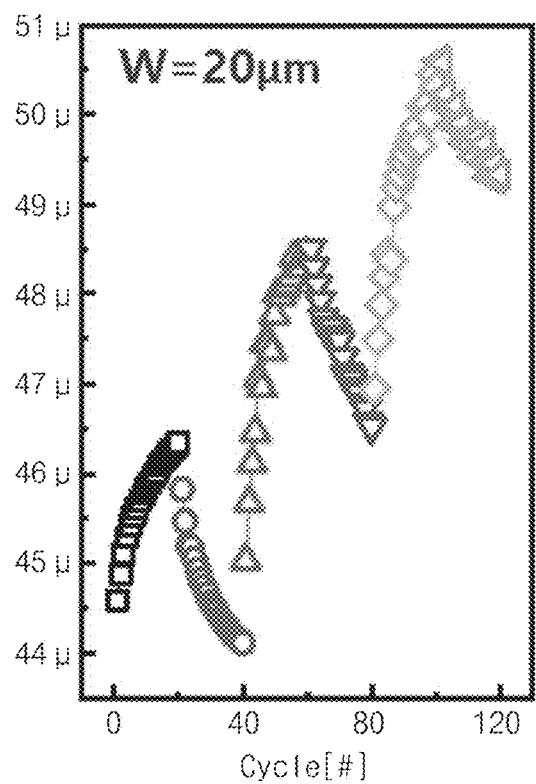
Figure 20:
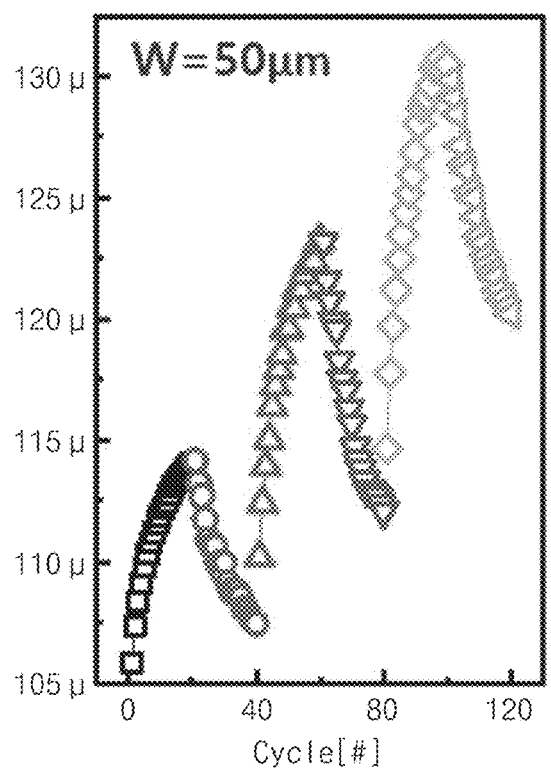
Figure 21:
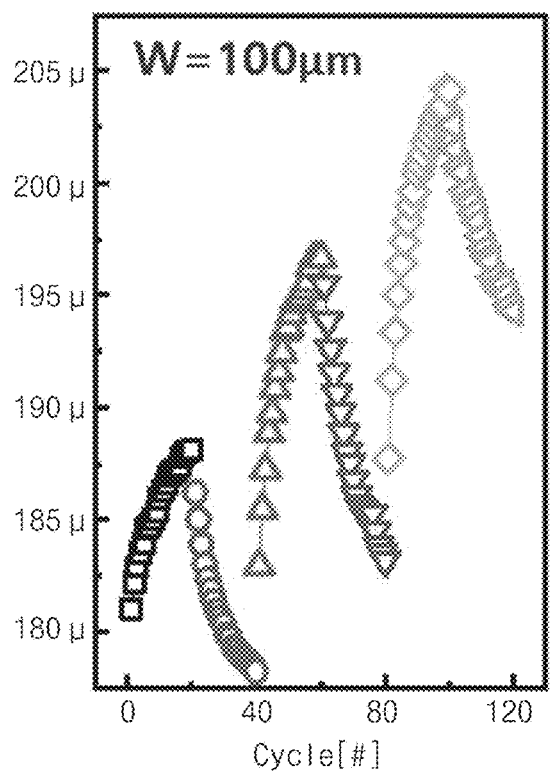

For understanding the electrical switching characteristics, X-ray photoelectron spectroscopy (XPS) analysis was performed with respect to each layer of the manufactured device. FIG. 12 illustrates the result of XPS analysis for Cu of a three terminal neuromorphic synaptic device manufactured according to an embodiment of the inventive concept. FIG. 13 illustrates XPS analysis for HfOx of a three terminal neuromorphic synaptic device manufactured according to an embodiment of the inventive concept. FIG. 14 illustrates XPS analysis for $WO_3$ of a three terminal neuromorphic synaptic device manufactured according to an embodiment of the inventive concept. FIG. 15 illustrates an XPS analysis result for $WO_x$ of a three terminal neuromorphic synaptic device manufactured according to an embodiment of the inventive concept. FIG. 16 illustrates a TEM image obtained through Fast Fourier Transform in a three terminal neuromorphic synaptic device manufactured according to an embodiment of the inventive concept.

Referring to FIG. 12, a single Cu2p peak intensity was observed at the binding energy of 931 eV. This means that Cu is maintained in a metallic state without binding to oxygen. Referring to FIG. 13, because of sputtering deposition of HfOx, a non-stoichiometric HfOx electrolyte comprising both Hf—Hf metal and Hf—O oxide bonds was observed, making it possible to move Cu ions. Referring to FIGS. 14 and 15, Cu and Hf have the same state regardless of the composition of the channel layer of WO. It should be noted that a metal W peak (various W4F peaks) greater than 31 eV and 33.5 eV in the channel layer of WOx rather than the channel layer of $WO_3$. The observation result is matched with that the movement of Cu ions are accelerated, as the voltage drop induced in the electrolyte in the channel of WOx increased. A polycrystalline layer of HfOx is identified on an amorphous layer of WOx through Fast Fourier transform TEM image as illustrated in FIG. 16, and the polycrystalline layer of HfOx on the amorphous layer of WOx may accelerate ion migration.

FIGS. 17 to 21 are views illustrating the change characteristic of the channel current as a function of a channel width (5 μm, 10 μm, 20 μm, 50 μm, or 100 μm) of a three terminal neuromorphic synaptic device manufactured according to an embodiment of the inventive concept. In FIGS. 17 to 21, the horizontal axis represents the number of times that the gate voltage pulse is applied. The gate voltage pulse magnitude changed the channel current and the current control range, which means that ions migrated through the ion transfer layer change the conductance in the channel region. The channel current proportional to the active cell size shows that Cu ions move uniformly, which differs from the switching mechanism. As the channel width is increased to 100 μm from 5 μm at the gate length of 4 μm, an initial channel current linearly increased. In addition, an analog synaptic operation by a gate voltage ranging from ±3 V to ±5 V exhibited reversible and reproducible characteristics at various channel widths.

Figure 22:
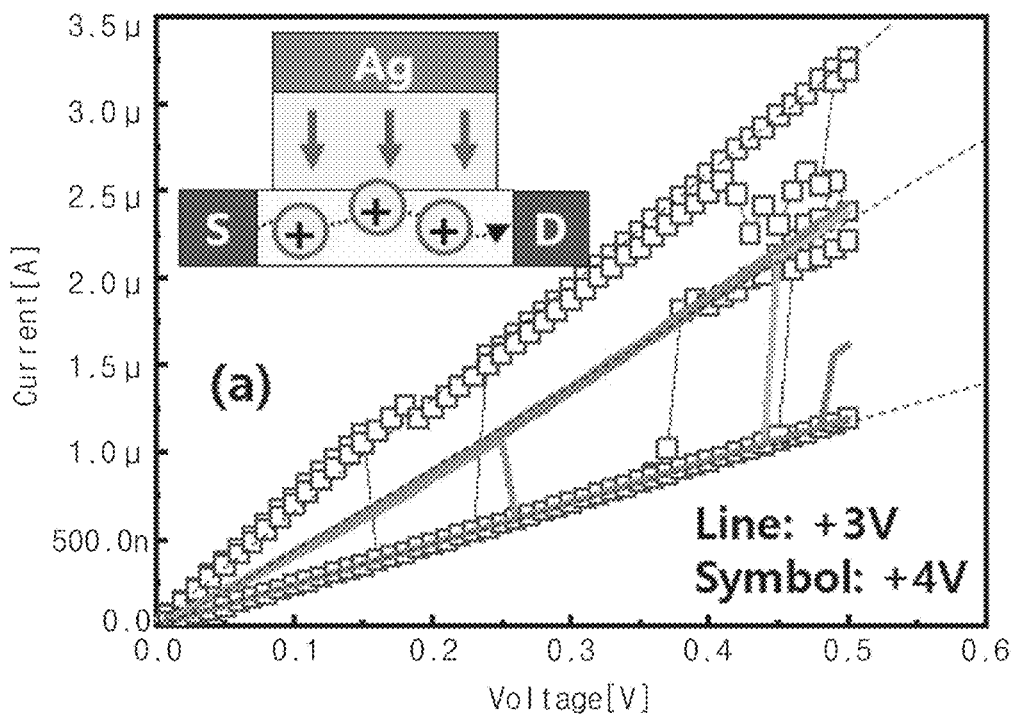
FIGS. 22 and 23 are views illustrating a channel current characteristic obtained, as a gate voltage is applied in a three terminal neuromorphic synaptic device having an Ag gate electrode.
Figure 23:
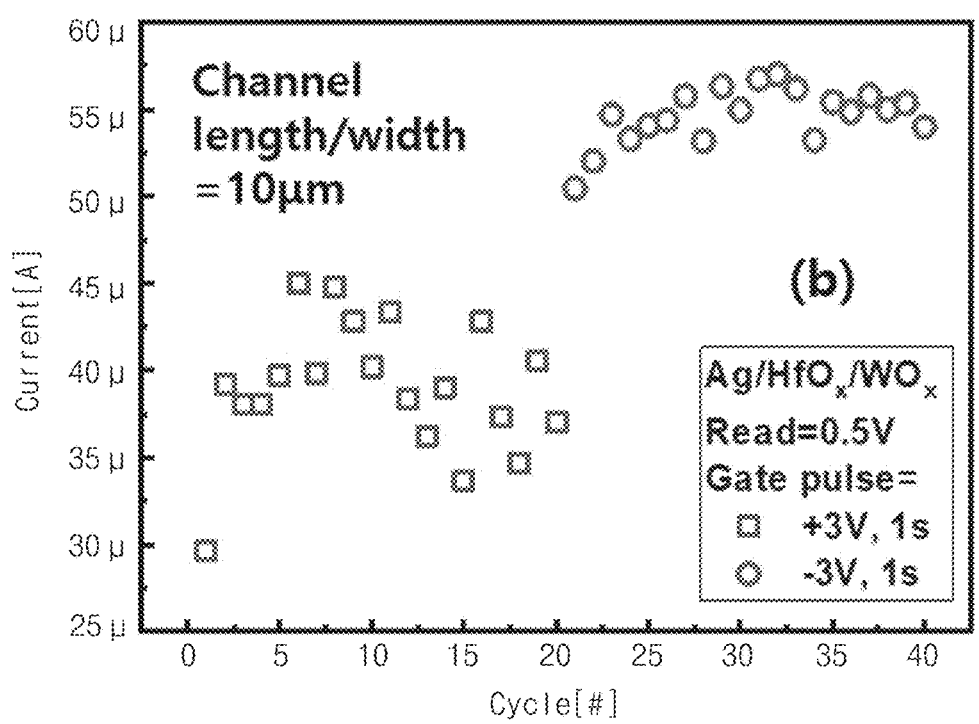

To determine the role of active ions, a device having an Ag gate electrode was manufactured. FIGS. 22 and 23 are views illustrating the change characteristic in a channel current, as a gate voltage is applied in a three terminal neuromorphic synaptic device having the Ag gate electrode.

FIG. 22 illustrates a measurement result of a device manufactured by designing a channel distance and a channel width to 100 μm and 5 μm, respectively, and FIG. 23 illustrates a measurement result of a device manufactured by designing a channel distance and a channel width to 100 μm and 10 μm, respectively.

Ag ions have faster ion mobility than that of Cu ions in a solid electrolyte. Accordingly, when using Ag electrodes, electrons move through the WOx channel due to Ag penetration and meet Ag ions, thereby rapidly increasing or decreasing and randomly changing a channel current. When applying a gate voltage of 4 V (see 'Symbol' in FIG. 22) which is greater than a gate voltage of 3 V (see 'Line' in FIG. 22), greater current fluctuation was shown. Referring to FIG. 23, when the channel width is increased to 10 μm, more many leakage paths related to Ag ions were caused, and the control of a channel current based on the polarities of the gate voltage was difficult. Accordingly, it may be recognized that the increase or decrease in channel current is controlled by uniformly driving Cu ions in opposite vertical directions, depending on the polarities of the gate voltage, when applying Cu to the gate electrode instead of Ag.

Figure 24:
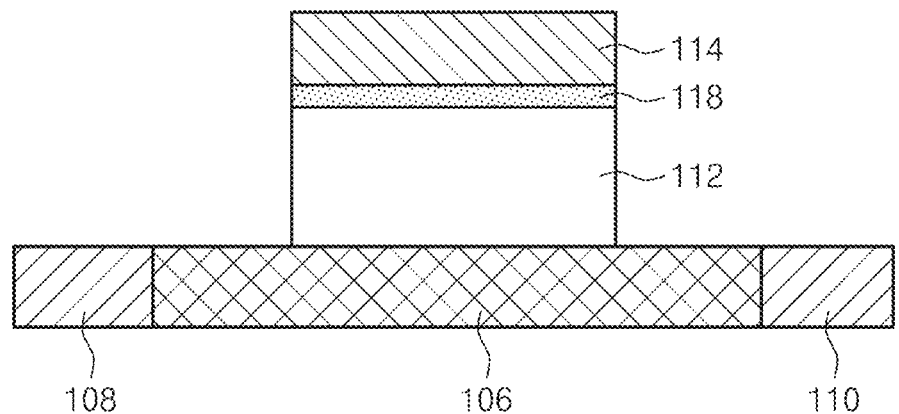
FIG. 24 is a cross-sectional view schematically illustrating a three terminal neuromorphic synaptic device according to a second embodiment of the inventive concept.

FIG. 24 is a cross-sectional view schematically illustrating a three terminal neuromorphic synaptic device according to a second embodiment of the inventive concept. The three terminal neuromorphic synaptic device according to the second embodiment of the inventive concept is different from that of the first embodiment described above in that the three terminal neuromorphic synaptic device further includes a metal liner layer 118 interposed between the ion transfer layer 112 and the gate electrode 114. The duplicated description of components identical to or corresponding to those of the first embodiment will be omitted. The metal liner layer 118 is for controlling active ions (e.g., Cu ions) of the gate electrode 114 and may include a material such as TiN, TiW, or Ti. An ion control voltage may be applied to the metal liner layer 118 by the voltage application unit. An amount of Cu ions moving may be controlled depending on a voltage applied to the metal liner layer 118. Accordingly, the change characteristic of a channel current as a function of the gate voltage applied may be controlled.

Figure 25:
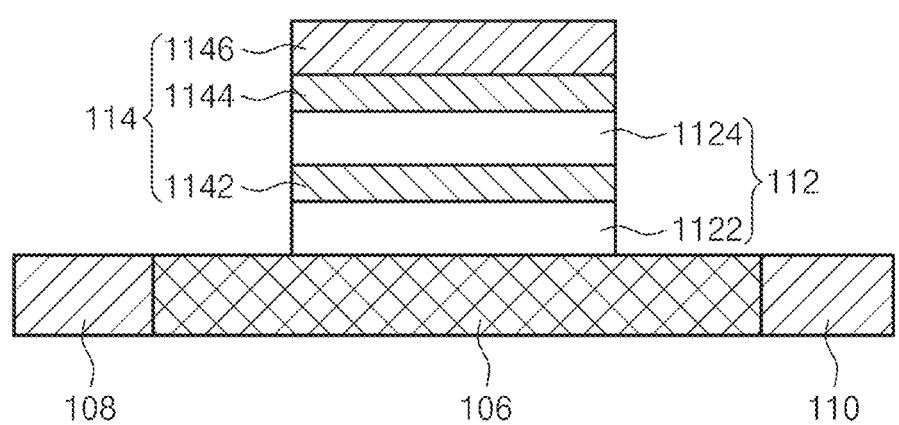
FIG. 25 is a cross-sectional view schematically illustrating a three terminal neuromorphic synaptic device, according to a third embodiment of the inventive concept.

FIG. 25 is a cross-sectional view schematically illustrating a three terminal neuromorphic synaptic device according to a third embodiment of the inventive concept. The three terminal neuromorphic synaptic device according to the third embodiment of the inventive concept is different from that of the above-described embodiment, in that the gate electrode 114 includes a first copper electrode 1142, a second copper electrode 1144, and a metal electrode 1146, and the ion transfer layer 112 includes a first ion transfer layer 1122 and a second ion transfer layer 1124. The duplicated description of components identical to or corresponding to those of the above-described embodiment will be omitted.

The first ion transfer layer 1122, the first copper electrode 1142, the second ion transfer layer 1124, the second copper electrode 1144, and the metal electrode 1146 may have a laminate structure sequentially stacked on the channel region 106. The first ion transfer layer 1122 and the second ion transfer layer 1124 may include the same electrolyte or different electrolytes. The first copper electrode 1142 and the second copper electrode 1144 may include a Cu material, and the metal electrode 1146 may include a Cu material or various other electrode materials. The second copper electrode 1144 may be omitted.

In other words, the ion transfer layer 112 may include a copper metal material, for example, a material containing a copper metal, such as Cu, $CuO_2$, or Cu-doped HfOx. According to the present embodiment, Cu ions may be received from the first copper electrode 1142 between the first ion transfer layer 1122 and the second ion transfer layer 1124, thereby causing changes in resistance and conductance of the channel region.

Figure 26:
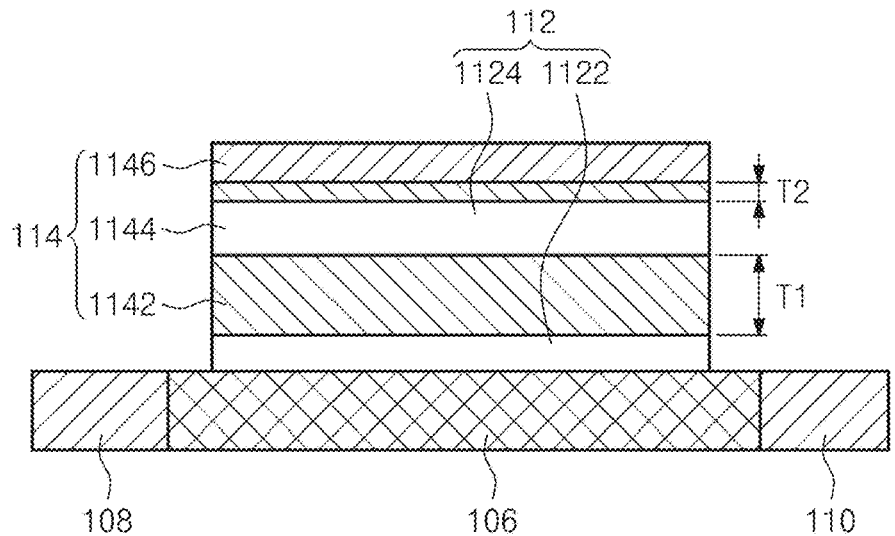
FIG. 26 is a cross-sectional view schematically illustrating a three terminal neuromorphic synaptic device according to a fourth embodiment of the inventive concept.

FIG. 26 is a cross-sectional view schematically illustrating a three terminal neuromorphic synaptic device according to a fourth embodiment of the inventive concept. The three terminal neuromorphic synaptic device 100 according to the fourth embodiment of the inventive concept is different from that of the above-described third embodiment, in that the thickness T1 and T2 of the first copper electrode 1142 and the second copper electrode 1144 are different from each other. The duplicated description of components identical to or corresponding to those of the third embodiment will be omitted. According to the fourth embodiment of the inventive concept, the first copper electrode 1142 is formed to have a thickness thicker than that of the second copper electrode 1144, but the second copper electrode 1144 may be formed to have a thickness thicker than that of the first copper electrode 1142 if necessary.

Figure 27:
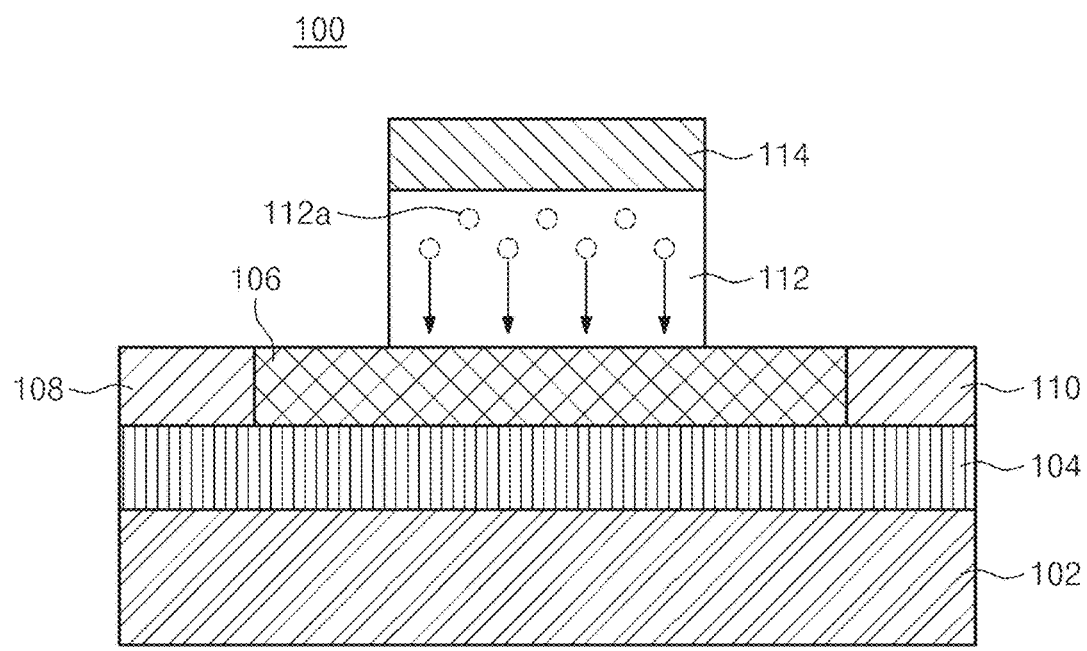
FIG. 27 is a cross-sectional view schematically illustrating a three terminal neuromorphic synaptic device according to a fifth embodiment of the inventive concept.

FIG. 27 is a cross-sectional view schematically illustrating a three terminal neuromorphic synaptic device according to a third embodiment of the inventive concept. The three terminal neuromorphic synaptic device according to the fifth embodiment of the inventive concept is different from that of the above-described embodiments, in that the three terminal neuromorphic synaptic device further includes a first heat blocking layer 104 interposed between the substrate 102 and the channel region 106. The duplicated description of components identical to or corresponding to those of the above-described embodiment will be omitted.

The first heat blocking layer 104 may be provided on the substrate 102. The first heat blocking layer 104 may serve to prevent heat, which is emitted during the operation of the three terminal neuromorphic synaptic device 100, from being radiated to the outside. To this end, the first heat blocking layer 104 may include a material having a lower thermal conductivity than that of the channel region 106.

The first heat blocking layer 104 is interposed between the substrate 102, and the channel region 106, the source electrode 108, and the drain electrode 110, thereby preventing the heat emitted during operation of the three terminal neuromorphic synaptic device from being radiated to the outside, and allowing the emitted heat to stay inside the three terminal neuromorphic synaptic device 100. In this case, an amount of heat transferred may be adjusted by adjusting the thickness of the first heat blocking layer 104.

In this case, the mobility of active ions 112a moving from the ion transfer layer 112 to the channel region 106 may be increased. Accordingly, current change between the source electrode 108 and the drain electrode 110 is increased, and more many multi-level states may be secured.

According to an embodiment, the first heat blocking layer 104 may include at least one material selected from the group consisting of a binary oxide (e.g., TaOx) having a preset critical thermal conductivity or less, a ternary oxide ($La_2Mo_2O_9$, $Gd_6Ca_4(SiO_4)_6O$, $Bi_4Ti_3O_{12}$), and a chalcogenide-based compound (e.g., GeST). In this case, the preset critical thermal conductivity may be 1 W/mk.

The channel region 106 may be provided on the first heat blocking layer 104. The channel region 106 may be interposed between the source electrode 108 and the drain electrode 110, on the first heat shielding layer 104. The channel region 106 may serve to accumulate active ions moved from the ion transfer layer 112 to the channel region 106. The source electrode 108 and the drain electrode 110 may be provided on the first heat blocking layer 104 while interposing the channel region 106 between the source electrode 108 and the drain electrode 110.

According to an embodiment, the first heat blocking layer 104 is provided under the channel region 106, thereby preventing the heat emitted during operation of the three terminal neuromorphic synaptic device from being radiated to the outside, and allowing the emitted heat to stay inside the three terminal neuromorphic synaptic device 100. Accordingly, the change width of the excitatory post-synaptic current is increased by increasing the mobility of the active ions moving from the ion transfer layer 112 to the channel region 106. In this case, the three terminal neuromorphic synaptic device 100 may ensure more many multi-level states.

Figure 28:
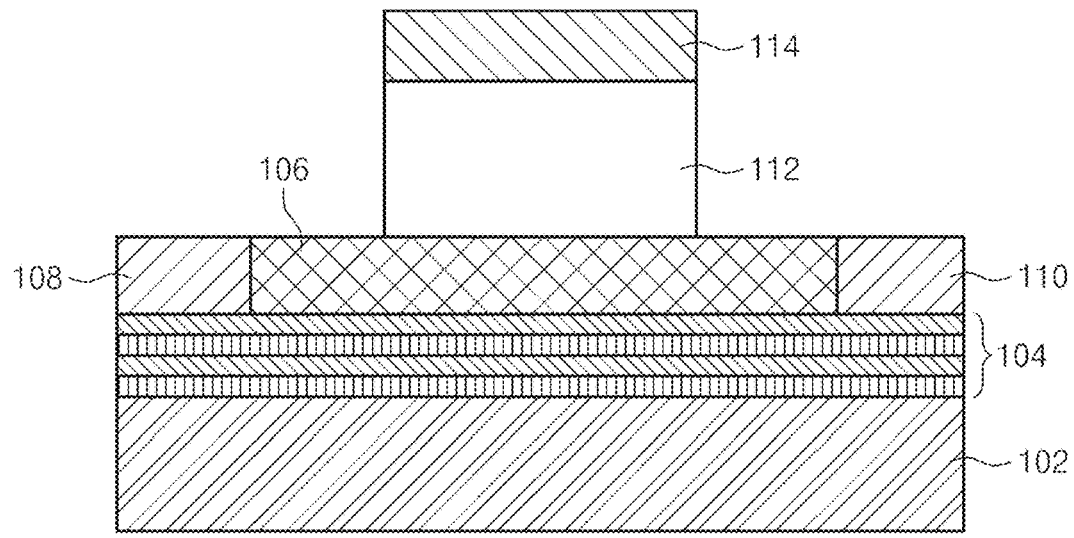
FIG. 28 is a cross-sectional view illustrating a three terminal neuromorphic synaptic device according to a sixth embodiment of the inventive concept.

FIG. 28 is a cross-sectional view schematically illustrating a three terminal neuromorphic synaptic device according to a third embodiment of the inventive concept. The following description will be made while focusing on the difference from the above-described embodiments. The first heat blocking layer 104 may include a plurality of layers. According to an embodiment, the first heat blocking layer 104 may be provided by stacking a plurality of layers having the thermal conductivity equal to or less than the preset critical conductivity. For example, the first heat blocking layer 104 may be provided by stacking a plurality of oxide chalcogenide layers. However, the inventive concept is not limited thereto, and a plurality of layers may include layers having different thermal conductivity.

A plurality of layers may be provided by alternately stacking layers including materials having different thermal conductivity. For example, the first heat blocking layer 104 may be provided by alternatively stacking a layer including a chalcogenide-based compound (for example, an amorphous GeSbTe (GST) layer) and a layer including at least one selected from the group consisting of TiN, Ti, and C. In this case, the thermal conductivity of the first heat blocking layer 104 may be lowered to 0.33 W/mK. In this case, the thicknesses of layers constituting the first heat blocking layer 104 may be different from each other, and the thermal conductivity of the first heat blocking layer 104 may be adjusted by adjusting the thickness of each layer.

Figure 29:
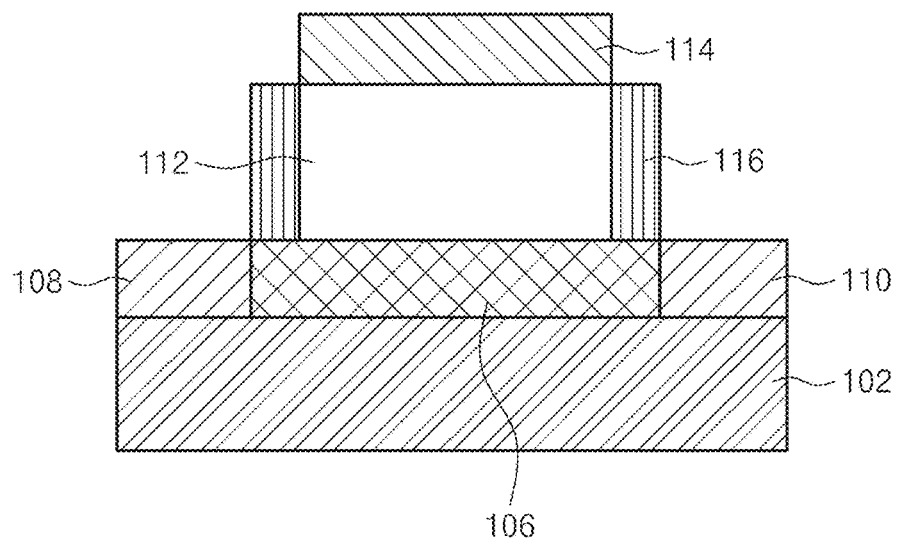
FIGS. 29 to 31 are views illustrating a three terminal neuromorphic synaptic device according to various embodiments of the inventive concept.
Figure 30:
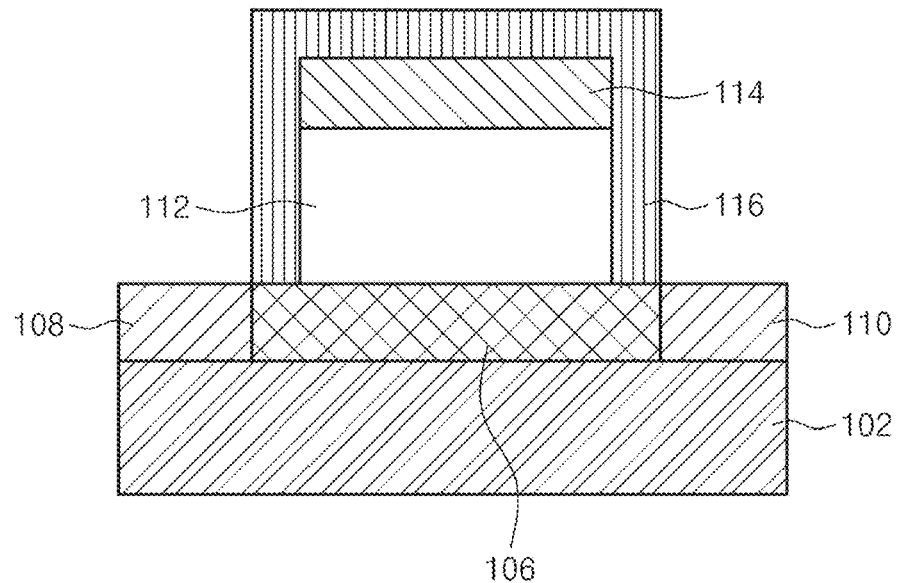
Figure 31:
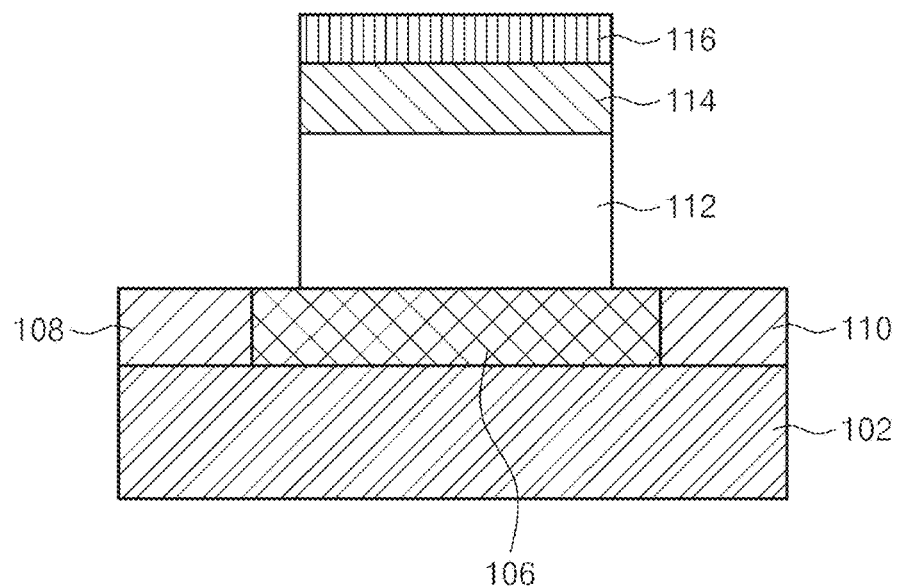

FIGS. 29 to 31 are views illustrating a three terminal neuromorphic synaptic device according to various embodiments of the inventive concept. First, referring to FIG. 29, the three terminal neuromorphic synaptic device may include the substrate 102, the channel region 106, the source electrode 108, the drain electrode 110, the ion transfer layer 112, a gate electrode 114, and a second heat blocking layer 116. In this case, the substrate 102, the channel region 106, the source electrode 108, the drain electrode 110, the ion transfer layer 112, and the gate electrode 114 are the same as or similar to components illustrated as in FIG. 1, and thus the details thereof will be omitted.

The second heat blocking layer 116 may be provided to surround side portions of the ion transfer layer 112. The second heat blocking layer 116 may include a material having a lower thermal conductivity than that of the ion transfer layer 112. In this case, the heat emitted during the operation of the three terminal neuromorphic synaptic device 100 may be prevented from being radiated to the outside to minimize heat loss. In addition, the heat may be prevented from being spread to the peripheral portion of the three terminal neuromorphic synaptic device 100, thereby concentrating heat into the three terminal neuromorphic synaptic device 100.

The second heat blocking layer 116 may include a material having a lower thermal conductivity than that of the ion transfer layer 112. Accordingly, the active ion of the ion transfer layer 112 may be prevented from being moved to the second heat blocking layer 116 and to be induced to be concentratedly moved into the channel layer 106. The second heat blocking layer 116 may concentrate heat into the three terminal neuromorphic synaptic device 100 and may concentrate the active ion of the ion transfer layer 112 into the channel region 106, thereby increasing the mobility of the active ion. Accordingly, more many active ions may be transferred to the channel region 106, thereby more enhancing the change extent of the excitatory post-synaptic current.

Referring to FIG. 30, the second heat blocking layer 116 may be provided to surround not only the side surface of the ion transfer layer 112 but also an upper portion of the gate electrode 114. In this case, the heat blocking efficiency due to the second heat shielding layer 116 may be further improved. Referring to FIG. 31, the second heat blocking layer 116 may be provided to surround an upper portion of the gate electrode 114. Meanwhile, both the first heat shielding layer 104 illustrated in FIG. 1 and the second heat shielding layer 116 illustrated in FIG. 4 or any one of the first heat shielding layer 104 illustrated in FIG. 1 and the second heat shielding layer 116 illustrated in FIG. 4 may be formed in the three terminal neuromorphic synaptic device 100.

Figure 32:
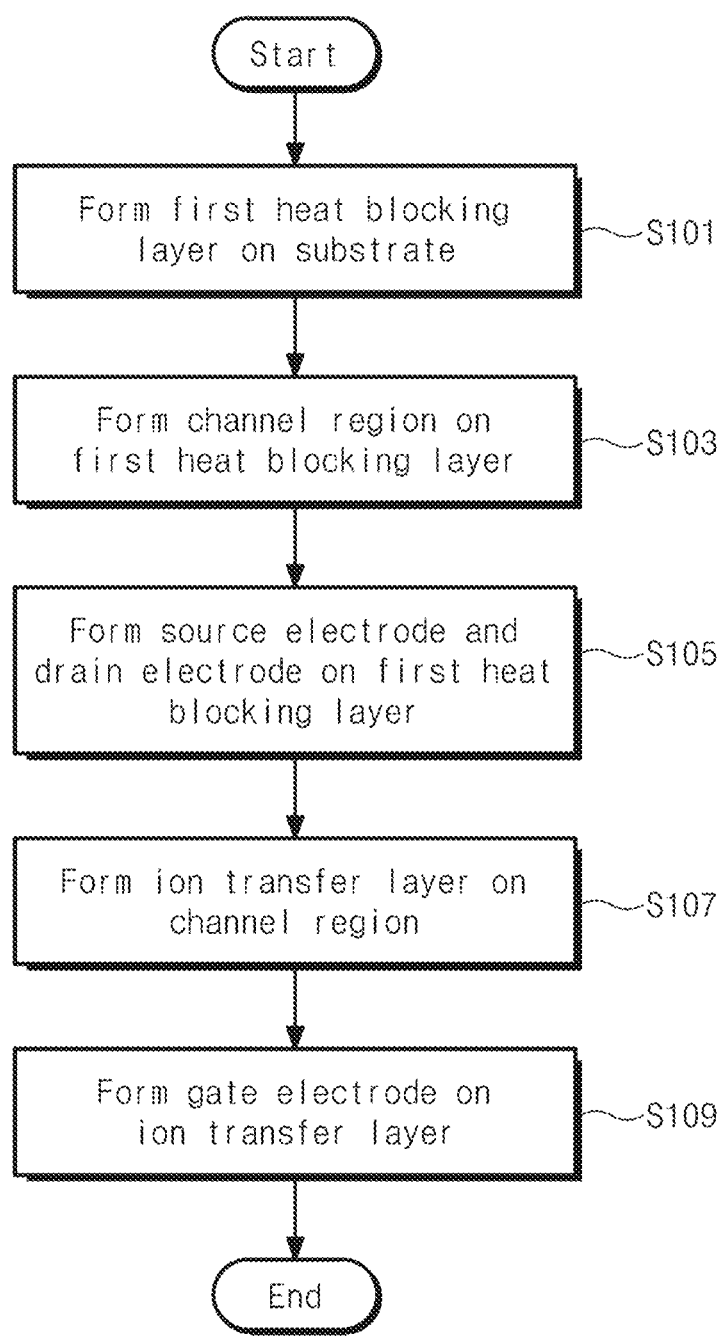
FIG. 32 is a flowchart illustrating a method for manufacturing a three terminal neuromorphic synaptic device according to a fifth embodiment of the inventive concept.

FIG. 32 is a flowchart illustrating a method for fabricating a three terminal neuromorphic synaptic device, according to a fifth embodiment of the inventive concept. Referring to FIGS. 27 and 32, the first heat blocking layer 104 is formed on the substrate 102 (S101). The first heat blocking layer 104 may include one layer and may include a plurality of layers. For example, the first heat blocking layer 104 may be provided by depositing, on the substrate 102, at least one material selected from the group consisting of a binary oxide (e.g., TaOx), a ternary oxide ($La_2Mo_2O_9$, $Gd_6Ca_4(SiO_4)_6O$, and $Bi_4Ti_3O_{12}$), and a chalcogenide-based compound (amorphous GeSbTe(GST)) having preset critical thermal conductivity or less. In this case, for the depositing process, various well-known depositing technologies may be used.

Next, the channel region 106 is formed on the first heat blocking layer 104 (S103). The channel region 106 may include various materials having conductivity changed by active ions 112a. Next, a source electrode 108 and a drain electrode 110 are formed on the first heat blocking layer 104, respectively (S105). The source electrode 108 and the drain electrode 110 may be formed at opposite sides of the channel region 106, on the first heat blocking layer 104.

Next, the ion transfer layer 112 is formed on the channel region 106 (S107). The ion transfer layer 112 may be formed to include the active ion 112a. The ion transfer layer 112 may include a material serving as an electrolyte such that the active ion 112a is moved between the channel region 106 and the ion transfer layer 112. Next, the gate electrode 114 is formed on the ion transfer layer 112 (S109).

Meanwhile, although the above description is made while focusing on that the source electrode 108 and the drain electrode 110 are formed at opposite sides of the channel region 106 after forming the channel region 106 on the first heat blocking layer 104, the inventive concept is not limited thereto. For example, after forming the source electrode 108 and the drain electrode 110 on the first heat transfer layer 104 while spacing the source electrode 108 away from the drain electrode 110, the channel region 106 may be formed on the first heat blocking layer 104 while surrounding the source electrode 108 and the drain electrode 110. The source electrode 108 and the drain electrode 110 may be formed at opposite sides of the lower portion of the channel region 106. In addition, according the disclosed embodiment, the positions of the channel region 106, the source electrode 108, and the drain electrode 110 may be changed by reflecting various other transistors.

Figure 33:
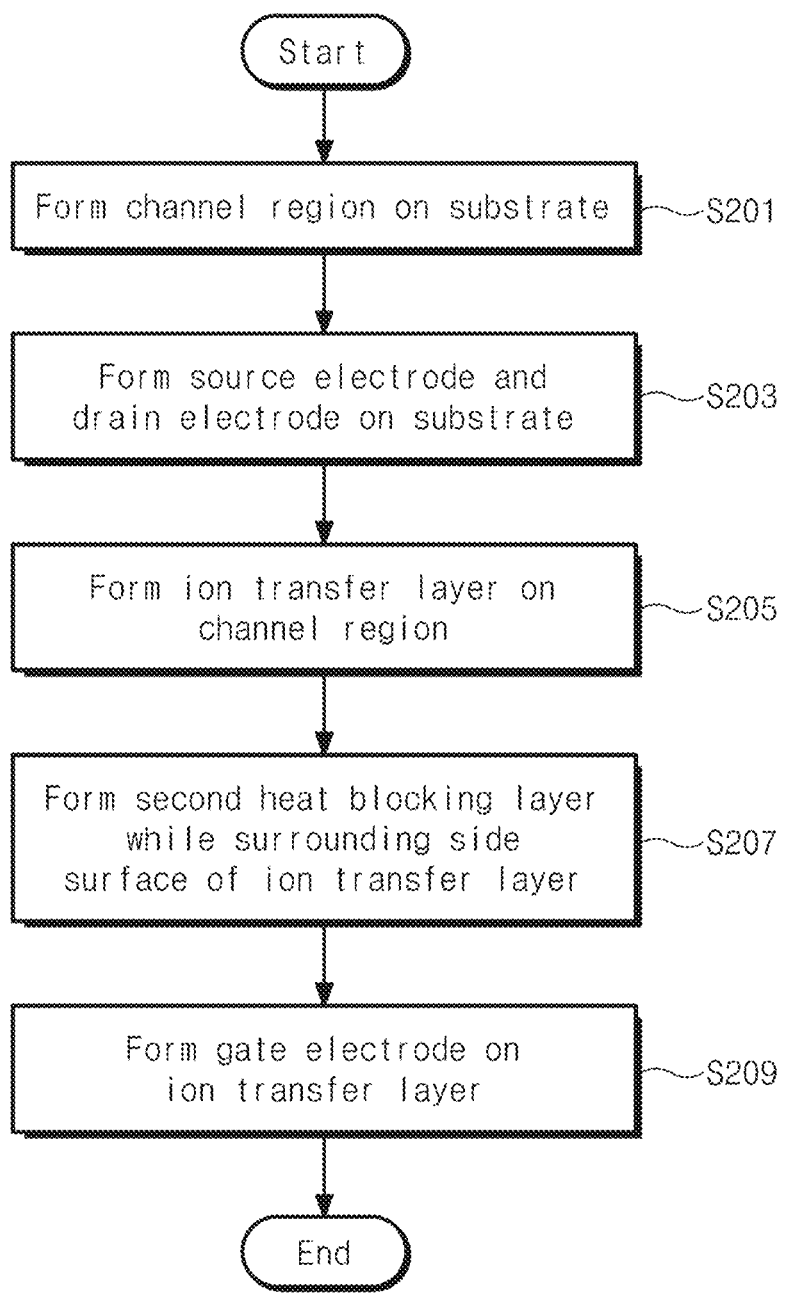
FIG. 33 is a cross-sectional view schematically illustrating a three terminal neuromorphic synaptic device according to a sixth embodiment of the inventive concept.

FIG. 33 is a flowchart illustrating a method for fabricating a three terminal neuromorphic synaptic device, according to a sixth embodiment of the inventive concept. Referring to FIGS. 28 and 33, the channel region 106 is formed on the substrate 102 (S201). Next, the source electrode 108 and the drain electrode 110 are formed on the substrate 102, respectively (S203). The source electrode 108 and the drain electrode 110 may be formed at opposite sides of the channel region 106, on the substrate 102.

Next, the ion transfer layer 112 is formed on the channel region 106 (S205), and the second heat blocking layer 116 is formed while surrounding the side surfaces of the ion transfer layer 112 (S207). Next, the gate electrode 114 is formed on the ion transfer layer 112 (S209). In this case, although the above embodiment has been described while focusing on that the gate electrode 114 is formed, after forming the second heat blocking layer 116 while surrounding the side surfaces of the ion transfer layer 112, the inventive concept is not limited thereto. For example, after forming the gate electrode 114 on the ion transfer layer 112, the second heat blocking layer 116 may be formed while surrounding the side surfaces of the ion transfer layer 112. In this case, the second heat blocking layer 116 may be formed on the gate electrode 114.

Embodiments of the inventive concept provide a three terminal neuromorphic synaptic device capable of linearly adjusting a resistance and a conductance in a channel region by adjusting an active ion, such as a copper ion of a gate electrode, using a gate voltage.

In addition, according to an embodiment of the inventive concept, the heat blocking layer is provided under the channel region and on side surfaces of the ion transfer layer, thereby preventing heat, which is emitted during the operation of the three terminal neuromorphic synaptic device, from being radiated to the outside and allowing the emitted heat to stay inside the three terminal neuromorphic synaptic device. Accordingly, the mobility of the active ions moving from the ion transfer layer to the channel region is increased, thereby increasing the change of an excitatory post-synaptic current Accordingly, the multi-level state may be more many ensured in the three terminal neuromorphic synaptic device.

The technical effects obtained in the inventive concept are not limited to the aforementioned effects, and any other technical effects not mentioned herein will be clearly understood from the following description by those skilled in the art to which the inventive concept pertains.

The above description has been made for the illustrative purpose. Furthermore, the above-mentioned contents describe an embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. The written embodiment describes the best state for implementing the technical spirit of the inventive concept, and various changes required in the detailed application fields and purposes of the inventive concept can be made. Furthermore, it should be construed that the attached claims include other embodiments.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A three terminal neuromorphic synaptic device comprising:
 a substrate;
 a source electrode and a drain electrode provided on the substrate while being spaced apart from each other;
 a channel region provided to be electrically connected between the source electrode and the drain electrode, on the substrate;
 an ion transfer layer provided on the channel region;
 a gate electrode provided on the ion transfer layer;
 a voltage application unit to apply a gate voltage to the gate electrode;
 a metal liner layer interposed between the ion transfer layer and the gate electrode, the metal liner layer including at least one of titanium nitride (TiN), titanium tungsten (TiW), and titanium (Ti); and
 a second heat blocking layer provided on a side surface of the ion transfer layer, a side surface of the gate electrode, and an upper surface of the gate electrode, the second heat blocking layer including a material having a thermal conductivity and an ion conductivity lower than a thermal conductivity and an ion conductivity of the ion transfer layer,
 wherein the ion transfer layer includes an electrolyte material to transfer an active ion of the gate electrode between the gate electrode and the channel region, in response to the gate voltage applied to the gate electrode,
 wherein the voltage application unit adjusts a resistance and a conductance of the channel region by changing an amount of active ions accumulated in the channel region, depending on the number of times that the gate voltage is applied,
 wherein the ion transfer layer includes a first ion transfer layer and a second ion transfer layer,
 wherein the gate electrode includes a first copper (Cu) electrode, a second Cu electrode, and a metal electrode including a metal material other than Cu,
 wherein the first ion transfer layer is provided on the channel region, the first Cu electrode is provided on the first ion transfer layer, the second ion transfer layer is provided on the first Cu electrode, the second Cu electrode is provided on the second ion transfer layer, and the non-Cu metal electrode is provided on the second Cu electrode.

2. The three terminal neuromorphic synaptic device of claim 1,
 wherein the channel region may include $WO_3$,
 wherein the ion transfer layer includes $HfO_2$,
 wherein the gate electrode includes Cu,
 wherein the active ion is a Cu ion, and
 wherein the ion transfer layer have a thickness of 25 nm to 50 nm.

3. The three terminal neuromorphic synaptic device of claim 1, wherein the first Cu electrode and the second Cu electrode are formed to have mutually different thickness.

4. The three terminal neuromorphic synaptic device of claim 1, further comprising:
 a first heat blocking layer interposed between the substrate and the channel region,
 wherein the first heat blocking layer includes a material having thermal conductivity lower than thermal conductivity of the channel region to increase mobility of the active ion moving from the ion transfer layer to the channel region, and
 wherein a current change between the source electrode and the drain electrode is increased by the increased mobility of the active ion.

5. The three terminal neuromorphic synaptic device of claim 4, wherein the first heat blocking layer is provided by stacking a plurality of layers having thermal conductivity equal to or less than preset critical conductivity, and
 wherein the plurality of layers are provided by alternately stacking layers including materials having different thermal conductivity.

6. The three terminal neuromorphic synaptic device of claim 4, wherein the first heat blocking layer includes at least one material selected from the group consisting of a binary oxide, a ternary oxide, and a chalcogenide-based compound having preset critical thermal conductivity or less.

7. The three terminal neuromorphic synaptic device of claim 1, wherein a height of the channel region is equal to heights of the source electrode and the drain electrode,
 wherein a length of the ion transfer layer is less than a length of the channel region,
 wherein a length of the gate electrode is less than the length of the channel region.

8. A method for manufacturing a three terminal neuromorphic synaptic device, the method comprising:
 forming a channel region, a source electrode, and a drain electrode on a substrate;
 forming an ion transfer layer on the channel region;
 forming a metal liner layer on the ion transfer layer, the metal liner layer including at least one of titanium nitride (TiN), titanium tungsten (TiW), and titanium (Ti),
 forming a gate electrode to apply a gate voltage onto the metal liner layer;
 forming a second heat blocking layer on a side surface of the ion transfer layer, a side surface of the metal liner layer, a side surface of the gate electrode, and an upper surface of the gate electrode, the second heat blocking layer including a material having a thermal conductivity and an ion conductivity lower than a thermal conductivity and an ion conductivity of the ion transfer layer; and
 forming a voltage application unit to apply a gate voltage to the gate electrode,
 wherein the ion transfer layer includes:
  an electrolyte material to transfer an active ion of the gate electrode between the gate electrode and the channel region, in response to the gate voltage applied to the gate electrode,
 wherein the voltage application unit is formed to change an amount of active ions accumulated in a region close to the channel region and a resistance of the channel region.

9. The method of claim 8, further comprising:
 forming a first heat blocking layer between the channel region and the substrate.

10. The method of claim 8, wherein a height of the channel region is equal to heights of the source electrode and the drain electrode,
  wherein a length of the ion transfer layer is less than a length of the channel region,
  wherein a length of the gate electrode is less than the length of the channel region.

\* \* \* \* \*